US006740464B2

(12) United States Patent
Maemoto

(10) Patent No.: US 6,740,464 B2
(45) Date of Patent: May 25, 2004

(54) LITHOGRAPHIC PRINTING PLATE PRECURSOR

(75) Inventor: Kazuo Maemoto, Shizuoka (JP)

(73) Assignee: Fuji Photo Film Co., Ltd., Minami Ashigara (JP)

(*) Notice: Subject to any disclaimer, the term of this patent is extended or adjusted under 35 U.S.C. 154(b) by 152 days.

(21) Appl. No.: 09/756,789

(22) Filed: Jan. 10, 2001

(65) Prior Publication Data

US 2001/0018159 A1 Aug. 30, 2001

(30) Foreign Application Priority Data

| | | |
|---|---|---|
| Jan. 14, 2000 | (JP) | P.2000-006970 |
| Jan. 25, 2000 | (JP) | P.2000-016042 |
| Jan. 27, 2000 | (JP) | P.2000-018967 |
| Jan. 27, 2000 | (JP) | P.2000-018968 |
| Apr. 4, 2000 | (JP) | P.2000-102463 |
| Apr. 4, 2000 | (JP) | P.2000-102468 |
| Apr. 4, 2000 | (JP) | P.2000-102471 |
| Apr. 4, 2000 | (JP) | P.2000-102476 |

(51) Int. Cl.[7] .................. G03F 7/00
(52) U.S. Cl. .................. 430/138; 430/270.1; 430/302; 430/303
(58) Field of Search .................. 430/138, 270.1, 430/302, 303; 101/457

(56) References Cited

U.S. PATENT DOCUMENTS

| | | | | | |
|---|---|---|---|---|---|
| 4,564,580 | A | * | 1/1986 | Ichimura et al. | 430/281.1 |
| 4,879,201 | A | * | 11/1989 | Hasegawa | 430/138 |
| 4,933,256 | A | * | 6/1990 | Kakimi | 430/138 |
| 5,340,693 | A | * | 8/1994 | Uytterhoeven et al. | 430/253 |
| 5,368,973 | A | * | 11/1994 | Hasegawa | 430/138 |
| 5,569,573 | A | * | 10/1996 | Takahashi et al. | 430/138 |
| 5,624,788 | A | * | 4/1997 | Murai et al. | 430/270.1 |
| 5,731,128 | A | * | 3/1998 | Kanda et al. | 430/281.1 |
| 5,773,192 | A | * | 6/1998 | Murai et al. | 430/270.1 |
| 5,948,591 | A | | 9/1999 | Vermeersch et al. | |
| 6,030,750 | A | | 2/2000 | Vermeersch et al. | |
| 6,162,578 | A | * | 12/2000 | Zheng et al. | 430/270.1 |
| 6,171,748 | B1 | * | 1/2001 | Tanaka et al. | 430/138 |
| 6,300,032 | B1 | * | 10/2001 | Van Damme et al. | 430/188 |
| 6,352,812 | B1 | * | 3/2002 | Shimazu et al. | 430/273.1 |
| 6,465,152 | B1 | * | 10/2002 | DoMinh et al. | 430/271.1 |
| 6,468,714 | B2 | * | 10/2002 | Kai et al. | 430/270.1 |
| 2001/0046638 | A1 | * | 11/2001 | Yanake et al. | 430/138 |
| 2002/0031715 | A1 | * | 3/2002 | Maemoto et al. | 430/138 |
| 2002/0033108 | A1 | * | 3/2002 | Akiyama et al. | 101/457 |
| 2002/0102488 | A1 | * | 8/2002 | Yanaka et al. | 430/138 |
| 2002/0117066 | A1 | * | 8/2002 | Kawamura et al. | 101/462 |
| 2002/0168582 | A1 | * | 11/2002 | Vermeersch et al. | 430/270.1 |

FOREIGN PATENT DOCUMENTS

| | | | | |
|---|---|---|---|---|
| EP | 0 646 476 A1 | | 4/1995 | |
| EP | 0 773 112 A1 | | 5/1997 | |
| EP | 0 881 096 A1 | | 12/1998 | |
| EP | 0 976 550 A1 | | 2/2000 | |
| EP | 1 031 415 A1 | | 8/2000 | |
| EP | 1 046 496 A2 | | 12/2000 | |
| EP | 1 057 622 A2 | | 12/2000 | |
| EP | 1 063 086 A1 | | 12/2000 | |
| EP | 1216831 | * | 6/2002 | B41C/1/10 |
| WO | WO94/23954 | | 10/1994 | |

* cited by examiner

*Primary Examiner*—Rosemary Ashton
*Assistant Examiner*—Amanda C. Walke
(74) *Attorney, Agent, or Firm*—Burns, Doane, Swecker & Mathis, L.L.P.

(57) ABSTRACT

A lithographic printing plate precursor is disclosed, comprising a hydrophilic support having thereon a heat-sensitive layer containing either a microcapsule containing a compound having a functional group capable of reacting by heat or a fine particulate polymer, wherein (1) when the heat-sensitive layer contains a fine particulate polymer, the fine particulate polymer may be a fine particulate polymer capable of combining or incapable of combining by heat used for the image formation and the fine particulate polymer has a functional group capable of reacting with a functional group present in another fine particulate polymer or with a functional group present in another component in the heat-sensitive layer; or (2) when the heat-sensitive layer contains a microcapsule containing a compound having a functional group capable of reacting by heat, the microcapsule may be a microcapsule having an outer wall capable of rupturing or incapable of rupturing by heat used for the image formation and a light-to-heat converting material is contained in the heat-sensitive layer or in a layer adjacent thereto.

6 Claims, No Drawings

LITHOGRAPHIC PRINTING PLATE PRECURSOR

FIELD OF THE INVENTION

The present invention relates to a negative lithographic printing plate precursor comprising a support having a hydrophilic surface, and a hydrophilic image-forming layer. More specifically, the present invention relates to a lithographic printing plate precursor capable of plate-making by scan exposure based on digital signals, ensuring high sensitivity and long press life, and providing a printed matter free of residual color and staining.

BACKGROUND OF THE INVENTION

In general, the lithographic printing plate comprises an ink-receptive image area for receiving ink during the printing process and a hydrophilic non-image area for receiving a fountain solution. As the lithographic printing plate precursor for use in the manufacture of such a lithographic printing plate, a PS plate comprising a hydrophilic support having provided thereon an ink-receptive photosensitive resin layer (ink-receptive layer) has heretofore been widely used. For manufacturing a lithographic printing plate, the lithographic printing plate precursor is usually subjected to mask exposure through a lith film and then the non-image area is dissolved and removed with a developer to obtain a desired printing plate.

In recent years, digitization technology of electronically processing, storing and outputting image information using a computer has been widely popularized. To cope with this digitization technology, various new systems for outputting an image have been proposed and are actually used. To keep up with this tendency, demands are increasing for a computer-to-plate (CTP) technique where a printing plate is directly produced by scanning an active radiation having high directivity, such as laser light, according to digitized image information without intervention of a lith film. Thus, it is an important technical problem to obtain a printing plate precursor suitable therefor.

In the plate-making process of conventional PS plates, the step of dissolving and removing the non-image area after the exposure is indispensable. This additional wet processing as an indispensable step is another problem demanded to be overcome in conventional techniques. Particularly in recent years, a great concern in industry as a whole is to give careful consideration to the global environment. From both of the environmental aspect and the process rationalization aspect to keep up with the digitization, demands for a simple processing, a dry processing no processing are more keenly increasing.

From this standpoint, the following method has been proposed for dispensing with the above-described processing step in conventional techniques. That is, the method is a plate-making system where a photosensitive layer capable of allowing the non-image area of the printing plate precursor to be removed during the usual printing process is used and the plate after the exposure is developed on a printing machine to obtain a final printing plate without passing through a development step. To speak more specifically, for example, a method of using a photosensitive layer soluble in a fountain solution or an ink solvent and dynamically removing the non-image area by the contact with the impression cylinder or blanket cylinder in the printing machine is known. However, if a conventional PS plate is applied to this printing plate in the on-press development system, the printing plate precursor must be stored under completely light-shielding and/or constant temperature conditions until it is mounted on a printing machine because the photosensitive layer is not fixed after the exposure.

In recent years, some solid lasers having high output become available at a low cost, such as semiconductor laser and YAG laser. With this progress, a method of using such a laser is expected as highly promising means for solving the above-described technical problem. In the high power density exposure system using these high output solid lasers, various phenomena different from the photoreaction occurring in conventional photosensitive material systems for low to medium power density exposure can be used. That is, various structural changes such as chemical change, phase change and morphology change can be used. The recording system by this high power density exposure is usually called "heat-mode recording". This is because in the high power density exposure system, the light energy absorbed by the photosensitive material is converted into heat in many cases and the heat generated is believed to bring about a desired phenomenon.

This heat-mode recording system is greatly advantageous in that fixing of an image after the exposure is not an essential matter.

More specifically, the phenomena used for the recording of an image on a heat-mode photosensitive material do not substantially occur in the exposure to light having an ordinary intensity or at an ordinary ambient temperature, therefore, fixing of an image after the exposure is not necessary. By virtue of this, for example, a system may be established, where a photosensitive layer capable of being insolubilized or solubilized by the heat-mode exposure is used and even when the layer after the imagewise exposure is exposed to the environmental light for an arbitrary time period and then developed (removal of non-image area), the image obtained can be free of any change.

By using this heat-mode recording, a lithographic printing plate precursor suitable for the above-described on-press development system may be obtained.

As one preferred example of the method for manufacturing a lithographic printing plate according to the heat-mode recording, a method of providing a hydrophilic image-forming layer on a hydrophilic support, imagewise exposing it by heat-mode exposure to cause changes in the solubility and dispersibility of the hydrophilic layer and if desired, removing the unexposed area by wet development has been proposed.

Conventional printing plate precursors using the heat-mode system have, however, a serious problem, that is, the non-image area is poor in the resistance against staining or the image area is low in the strength. In other words, improvements are necessary in the point that the change in solubility of the image-forming layer upon exposure is small near the support as compared with the change near the surface of the image-forming layer. In the printing plate precursor using the heat-mode system, generation of heat at the heat-mode exposure is attributable to light absorption by a light absorbent in the recording layer. Accordingly, the quantity of heat generated is large on the surface of recording layer and small near the support. Therefore, the degree of change in solubility of the recording layer is relatively low near the support, as a result, the ink-receptive layer in the exposed area which must provide a hydrophobic ink-receptive layer is sometimes removed during the development and/or printing process. If the ink-receptive layer in the image area of a negative printing plate precursor is removed, the printing performance encounters a problem of short press life. In particular, when a metal support having high thermal conductivity preferred in view of suitability for printing, such as A1, is used, the temperature near the support is much more prevented from increasing due to the thermal diffusion and the above-described problem comes out more seriously. For obtaining a sufficiently large change in solubility near the substrate, an extremely large exposure energy is necessary or an after-treatment such as heating must be performed after the exposure.

For example, Japanese Patent 2938397 describes a method of heat-fusing thermoplastic hydrophobic polymer fine particles by infrared laser exposure to form an image, fixing the plate on a cylinder of a printing machine and performing on-press development with fountain solution and/or ink. This method of forming an image by mere heat fusion ensures good on-press developability, however, when a heat-sensitive layer is provided directly on an aluminum substrate, the heat generated is deprived of by the aluminum substrate and a reaction does not take place on the interface between the substrate and the heat-sensitive layer, while gives rise to an insufficient press life.

Similarly, JP-A-9-127683 (the term "JP-A" as used herein means an "unexamined published Japanese patent application") and WO99/10186 describe a technique of heat-fusing thermoplastic fine particles and forming an image by the on-press development, however, the press life is also insufficient.

JP-A-8-48020 describes a method of providing an ink-receptive heat-sensitive layer on a porous hydrophilic support, exposing an infrared laser and attaining the fixing to a substrate by heat. However, with the ink-receptive coating, the on-press developability is bad and debris of the ink-receptive heat-sensitive layer adhere to the ink roller or printed matter.

JP-A-10-287062 describes a technique of providing an ink-receptive heat-sensitive layer on a hydrophilic swelling layer and in this case, absorption of heat by the aluminum substrate may be prevented, however, if ink is attached before the hydrophilic swelling layer is swelled by fountain solution, the ink poorly spreads and loss paper increases.

SUMMARY OF THE INVENTION

As described above, a heat-sensitive material favored with good on-press developability, high sensitivity and high press life has not yet been obtained. Accordingly, the object of the present invention is to provide a lithographic printing plate precursor capable of on-press development of forming an image by heat, which can exhibit good on-press developability and ensure printing of a large number of printed matters.

[1] A lithographic printing plate precursor comprising a hydrophilic support having thereon a heat-sensitive layer containing either a microcapsule containing a compound having a functional group capable of reacting by heat or a fine particulate polymer, wherein (1) when the heat-sensitive layer contains a fine particulate polymer, the fine particulate polymer may be a fine particulate polymer capable of combining or incapable of combining by heat used for the image formation and the fine particulate polymer has a functional group capable of reacting with a functional group present in another fine particulate polymer or with a functional group present in another component in the heat-sensitive layer; or (2) when the heat-sensitive layer contains a microcapsule containing a compound having a functional group capable of reacting by heat, the microcapsule may be a microcapsule having an outer wall capable of rupturing or incapable of rupturing by heat used for the image formation and a light-to-heat converting material is contained in the heat-sensitive layer or in a layer adjacent thereto.

[2] The lithographic printing plate precursor as described in [1] above, comprising a hydrophilic support having provided thereon a heat-sensitive layer containing a fine particulate polymer capable of combining by heat, wherein the fine particulate polymer has a functional group capable of reacting with a functional group present in another fine particulate polymer or with a functional group present in another component in the heat-sensitive layer.

[3] The lithographic printing plate precursor as described in [2] above, wherein the hydrophilic support is an aluminum substrate subjected to a surface roughening treatment and then to an anodization treatment.

[4] The lithographic printing plate precursor as described in [3] above, wherein the aluminum substrate is further subjected to a silicate treatment.

[5] The lithographic printing plate precursor as described in [1] above, comprising a hydrophilic support having provided thereon a heat-sensitive layer containing a fine particulate polymer incapable of combining by heat used for the image formation, wherein the fine particulate polymer has a functional group capable of reacting with a functional group present in another fine particulate polymer or with a functional group present in another component in the heat-sensitive layer.

[6] The lithographic printing plate precursor as described in [5] above, wherein the hydrophilic support is an aluminum substrate subjected to a surface roughening treatment and then to an anodization treatment.

[7] The lithographic printing plate precursor as described in [6] above, wherein the aluminum substrate is further subjected to a silicate treatment.

[8] The lithographic printing plate precursor as described in [1] above, comprising a hydrophilic support having thereon a heat-sensitive layer comprising a microcapsule having an outer wall incapable of rupturing by heat used for the image formation and containing a compound having a functional group capable of reacting by heat, wherein a light-to-heat converting material is contained in the heat-sensitive layer or in a layer adjacent thereto.

[9] The lithographic printing plate precursor as described in [8] above, wherein the compound diffused from the microcapsule is present either on the surface of the microcapsule or in the vicinity of the surface.

[10] The lithographic printing plate precursor as described in [8] above, which is obtained by dispersing microcapsules each containing a compound having a functional group capable of reacting by heat in a solvent which swells the outer wall of the microcapsules, coating the dispersion solution on a hydrophilic support and drying the solution.

[11] The lithographic printing plate precursor as described in [8] above, wherein the hydrophilic support is an aluminum substrate subjected to a surface roughening treatment and then to an anodization treatment.

[12] The lithographic printing plate precursor as described in [11] above, wherein the aluminum substrate is further subjected to a silicate treatment.

[13] The lithographic printing plate precursor as described in [1] above, comprising a hydrophilic support having thereon a heat-sensitive layer comprising a microcapsule having an outer wall capable of rupturing by heat used for the image information and containing a compound having a functional group capable of reacting by the heat wherein a light-to-heat converting material is contained in the heat-sensitive layer or in a layer adjacent thereto.

[14] The lithographic printing plate precursor as described in [13] above, wherein the hydrophilic support is an aluminum substrate subjected to a surface roughening treatment and then to an anodization treatment.

[15] The lithographic printing plate precursor as described in [14] above, wherein the aluminum substrate is further subjected to a silicate treatment.

DETAILED DESCRIPTION OF THE INVENTION

The present invention is described in detail below.

[Fine Particulate Polymer Capable of Combining by Heat at Image Formation]

The fine particulate polymer capable of combining by heat at the image formation (hereinafter simply referred to as "fine particulate polymer"), which is contained in the heat-sensitive layer of the lithographic printing plate precursor of the present invention, is not particularly limited as long as it has a functional group capable of reacting with a functional group present in another fine particulate polymer or with a functional group present in another component in the heat-sensitive layer, however, examples thereof include latex containing this functional group. The average particle size of the particles is preferably from 0.01 to 20 $\mu$m, more preferably from 0.05 to 2.0 $\mu$m, most preferably from 0.06 to 0.40 $\mu$m. If the average particle size is excessively large, bad resolution results, whereas if it is too small, the aging stability changes for the worse.

The fine particulate polymer may be reacted between fine particles through a functional group or may be reacted with a hydrophilic resin or a low molecular compound added to the heat-sensitive layer. It is also possible to introduce foreign functional groups which are thermally reactive with each other, into two or more kinds of fine particulate polymers and react the thermoplastic fine particulate polymers with each other. Examples of the reaction using this functional group include a polymerization reaction of an unsaturated group, an addition reaction of an isocyanate group or a block form thereof with a compound having an active hydrogen atom (for example, amine, alcohol and carboxylic acid), an addition reaction of an epoxy group with an amino group, a carboxyl group or a hydroxyl group, a condensation reaction of a carboxyl group with a hydroxyl group or an amino group, and a ring opening addition reaction of an acid anhydride with an amino group or a hydroxyl group. As long as a chemical bond can be formed, any of these reactions may be used.

The fine particulate polymer having this reactive functional group is preferably a polymer in which an acrylate group, a methacrylate group, a vinyl group, an allyl group, an epoxy group, an amino group, a hydroxyl group, a carboxyl group, an isocyanate, an acid anhydride or a protective group thereof is present. This functional group may be introduced at the time of polymerization or may be introduced using a polymer reaction after the polymerization.

In the case of introducing the group at the time of polymerization, a monomer having a functional group described above is preferably emulsion polymerized or suspension polymerized. Specific examples thereof include homopolymers and copolymers of a monomer such as allyl methacrylate, allyl acrylate, vinyl methacrylate, vinyl acrylate, glycidyl methacrylate, glycidyl acrylate, 2-isocyanate ethyl methacrylate or a block isocyanate thereof resulting from blocking with an alcohol, 2-isocyanate ethyl acrylate or a block isocyanate thereof resulting from blocking with an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, diacrylate and dimethacrylate, however, the present invention is not limited thereto. The copolymerizable monomer is not limited as long as it is a monomer not having a functional group related to the reaction, such as styrene, alkyl acrylate, alkyl methacrylate, acrylonitrile and vinyl acetate.

The functional group may also be introduced using a polymer reaction of the polymer. Examples thereof include the polymer reaction described in WO96-34316.

Also, after dissolving the polymer having a reactive group in a solvent -and further dispersing the dissolved polymer in a water, the solvent is evaporated to form the fine particulate polymer.

The fine particulate polymer capable of combining by heat at the image formation preferably has a hydrophilic surface and is dispersible in water. The film formed by coating only the fine particulate polymer and drying it at a temperature lower than the coagulation temperature preferably has a contact angle (aerial water droplet) lower than the contact angle (aerial water droplet) of a film fusion-formed by drying it at a temperature higher than the coagulation temperature. The surface of this fine particulate polymer may be rendered hydrophilic by adsorbing a hydrophilic polymer such as polyvinyl alcohol or polyethylene glycol, an oligomer or a hydrophilic low molecular compound to the fine particulate polymer surface, however, the method is not limited thereto.

The coagulation temperature of the fine particulate polymer capable of combining by heat at the image formation is preferably 70° C. or more and on taking account of the aging stability, more preferably 100° C. or more.

The fine particulate polymer capable of combining by heat at the image formation is preferably added in an amount of 50 wt % or more, more preferably 60 wt % or more, based on the heat-sensitive layer. If the amount added is less than this range, bad press life results.

[Fine Particulate Polymer Incapable of Combining by Heat Used for Image formation]

The fine particulate polymer incapable of combining by heat used for the image formation, which is contained in the heat-sensitive layer of the lithographic printing plate precursor of the present invention, is not particularly limited as long as it has a functional group capable of reacting with a functional group present in another fine particulate polymer or with a functional group present in another component in the heat-sensitive layer, however, examples thereof include a latex containing this functional group. The average particle size of the particles is preferably from 0.01 to 20 $\mu$m, more preferably from 0.05 to 2.0 $\mu$m, most preferably from 0.06 to 0.40 $\mu$m. If the average particle size is excessively large, bad resolution results, whereas if it is too small, the aging stability changes for the worse.

The fine particulate polymer may be reacted between fine particles through a functional group or may be reacted with a hydrophilic resin as another additive in the heat-sensitive layer, which is described later, or when a low molecular compound is contained, with the low molecular compound. It is also possible to introduce foreign functional groups which are thermally reactive with each other, into two or more kinds of fine particulate polymers and react the fine particulate polymers with each other. Examples of the reaction using this functional group include a polymerization reaction of an unsaturated group, an addition reaction of an isocyanate group or a block form thereof with a compound having an active hydrogen atom (for example, amine, alcohol and carboxylic acid), an addition reaction of an epoxy group with an amino group, a carboxyl group or a hydroxyl group, a condensation reaction of a carboxyl group with a hydroxyl group or an amino group, and a ring opening addition reaction of an acid anhydride with an amino group or a hydroxyl group. As long as a chemical bond can be formed, any of these reactions may be used.

The fine particulate polymer having this reactive functional group is preferably a polymer in which an acrylate group, a methacrylate group, a vinyl group, an allyl group, an epoxy group, an amino group, a hydroxyl group, a carboxyl group, an isocyanate, an acid anhydride or a protective group thereof is present. This functional group may be introduced at the time of polymerization or may be introduced using a polymer reaction after the polymerization.

In the case of introducing the polymer at the time of polymerization, a monomer having a functional group described above is preferably emulsion polymerized or suspension polymerized. Specific examples thereof include homopolymers and copolymers of a monomer such as allyl methacrylate, allyl acrylate, vinyl methacrylate, vinyl acrylate, glycidyl methacrylate, glycidyl acrylate, 2-isocyanate ethyl methacrylate and a block form thereof resulting from blocking with an alcohol, 2-isocyanate ethyl acrylate and a block form thereof resulting from blocking with an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, diacrylate and dimethacrylate, however, the present invention is not limited thereto. The monomer which can be copolymerized is not limited as long as it is a monomer not having a functional group related to the reaction, such as styrene, alkyl acrylate, alkyl methacrylate, acrylonitrile and vinyl acetate. However, a polyfunctional monomer is preferably introduced so as to prevent the polymer from combining by the heat generated upon irradiation of a laser ray. Specific examples of the polyfunctional monomer include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate and polyester acrylate oligomer;

- methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane and bis[p-(methacryloxyethoxy) phenyl]dimethylmethane;
- itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;
- crotonic acid esters such as ethylene glycol dicrotonate, tetramethylene glycol dicrotonate, penta-erythritol dicrotonate and sorbitol tetradicrotonate;
- isocrotonic acid esters such as ethylene glycol diisocrotonate, pentaerythritol diisocrotonate and sorbitol tetraisocrotonate; and
- maleic acid esters such as ethylene glycol dimaleate, triethylene glycol dimaleate, pentaerythritol dimaleate and sorbitol tetramaleate.

Other examples of the ester include aliphatic alcohol-based esters described in JP-B-46-27926 (the term "JP-B" as used herein means an "examined Japanese patent publication"), JP-B-51-47334 and JP-A-57-196231, esters having an aromatic skeleton described in JP-A-59-5240, JP-A-59-5241 and JP-A-2-226149, and esters containing an amino group described in JP-A-1-165613.

An amide monomer of an aliphatic polyhydric amine compound with an unsaturated carboxylic acid may also be used and specific examples thereof include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide and xylylenebismethacrylamide.

Other preferred examples of the amide-type monomer include those having a cyclohexylene structure described in JP-B-54-21726.

A urethane-based addition polymerizable compound produced by using an addition reaction of an isocyanate with a hydroxyl group is also suitably used and specific examples thereof include vinyl urethane compounds having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

$$CH_2{=}C(R_{41})COOCH_2CH(R_{42})OH \quad (A)$$

(wherein $R_{41}$ and $R_{42}$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 may be suitably used.

Furthermore, radical polymerizable compounds having an amino or sulfide structure within the molecule described in JP-A-63-277653, JP-A-63-260909 and JP-A-1-105238 may be used.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Nippon Secchaku Kyokaishi* (*Journal of Japan Adhesive Society*), Vol. 20, No. 7, pp. 300–308 (1984) may also be used.

The functional group may also be introduced using a polymer reaction of the polymer. Examples thereof include the polymer reaction described in WO96-34316.

The fine particulate polymer containing this functional group capable of chemically combining by heat preferably has a hydrophilic surface and is dispersible in water. The surface of this fine particulate polymer may be rendered hydrophilic by adsorbing a hydrophilic polymer such as polyvinyl alcohol or polyethylene glycol, an oligomer or a hydrophilic low molecular compound to the fine particulate polymer surface, however, the method is not limited thereto.

The fine particulate polymer containing a functional group capable of combining by heat is preferably added in an amount of 50 wt % or more, more preferably 60 wt % or more, based on the heat-sensitive layer.

[Microcapsule Having Outer Wall Incapable of Rupturing by Heat]

The microcapsule for use in the present invention has an outer wall incapable of rupturing by heat used for the image formation and contains a compound having a functional group capable of reacting by the heat. The average particle size thereof is preferably from 0.01 to 20 μm, more preferably from 0.05 to 2.0 μm, most preferably from 0.06 to 0.40 μm. If the average particle size is excessively large, bad resolution results, whereas if it is too small, the aging stability changes for the worse.

The microcapsule may have a structure such that microcapsules can react with each other through a thermally reactive group of the above-described compound contained therein or in the case where a hydrophilic resin or a low molecular compound, which are described later, is contained as another additive in the heat-sensitive layer, the microcapsule may have a structure such that the microcapsule can react with the hydrophilic resin or low molecular compound. Also, thermally reactive groups capable of thermally reacting with each other may be introduced into two or more kinds of microcapsules to have a structure such that the microcapsules can react with each other. Examples of the reaction using this thermally reactive group include a polymerization reaction of an unsaturated group, an addition reaction of an isocyanate group or a block form thereof with a compound having an active hydrogen atom (for example, amine, alcohol and carboxylic acid), an addition reaction of an epoxy group with an amino group, a carboxyl group or a hydroxyl group, a condensation reaction of a carboxyl group with a hydroxyl group or an amino group, and a ring opening addition reaction of an acid anhydride with an amino group or a hydroxyl group. As long as a chemical bond can be formed, any of these reactions may be used.

The microcapsule containing a compound having the thermally reactive group may be obtained by a method of encapsulating a compound (which is described in detail later) having a thermally reactive group such as an acrylate group, a methacrylate group, a vinyl group, an allyl group, an epoxy group, an amino group, a hydroxyl group, a carboxyl group, an isocyanate, an acid anhydride or a protective group thereof, or introducing this compound into the outer wall of a microcapsule. At the same time with the encapsulation of the compound having a thermally reactive group, the compound may be introduced into the outer wall of the microcapsule.

Examples of the compound having a thermally reactive group, which can be encapsulated, include compounds having an unsaturated group. The compound having an unsaturated group is a radical polymerizable compound having at least one ethylenically unsaturated double bond, and selected from the compounds having at least one, preferably two or more ethylenically unsaturated terminal bonds. Such compounds are widely known in this industrial field and those known compounds all can be used in the present invention without any limit. This compound has a chemical form of, for example, monomer, prepolymer, more specifically, dimer, trimer or oligomer, a mixture thereof or a copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyhydric amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydration condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and substitution reaction products of an unsaturated carboxylic acid ester or amide having an eliminating substituent such as halogen group or tosyloxy group with a monofunctional or polyfunctional alcohol, amine or thiol may also be suitably used. These compounds but where the unsaturated carboxylic acid is replaced by an unsaturated phosphonic acid, styrene, vinyl ether or the like may also be used.

Specific examples of the radical polymerizable compound which is an ester of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate and polyester acrylate oligomer;

- methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;
- itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;
- crotonic acid esters such as ethylene glycol dicrotonate, tetramethylene glycol dicrotonate, penta-erythritol dicrotonate and sorbitol tetradicrotonate;
- isocrotonic acid esters such as ethylene glycol diisocrotonate, pentaerythritol diisocrotonate and sorbitol tetraisocrotonate; and maleic acid esters such as ethylene glycol dimaleate, triethylene glycol dimaleate, pentaerythritol dimaleate and sorbitol tetramaleate.

Other examples of the ester include aliphatic alcohol-based esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetris-acrylamide, xylylenebisacrylamide and xylylenebis-methacrylamide.

Other preferred examples of the amide-type monomer include those having a cyclohexylene structure described in JP-B-54-21726.

A urethane-based addition polymerizable compound produced by using an addition reaction of isocyanate and a hydroxyl group may also be suitably used and specific examples thereof include vinyl urethane compounds having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

$$CH_2{=}C(R_{41})COOCH_2CH(R_{42})OH \quad (A)$$

(wherein $R_{41}$ and $R_{42}$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used.

Furthermore, radical polymerizable compounds having an amino or sulfide structure within the molecule described in JP-A-63-277653, JP-A-63-260909 and JP-A-1-105238 may be used.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Nippon Secchaku Kyokaishi* (*Journal of Japan Adhesive Society*), Vol. 20, No. 7, pp. 300–308 (1984) may also be used.

Preferred examples of the epoxy compound include glycerin polyglycidyl ether, polyethylene glycol diglycidyl ether, polypropylene diglycidyl ether, trimethylol propane polyglycidyl ether, sorbitol polyglycidyl ether, bisphenols, polyphenols and hydrogenated products thereof, namely, polyglycidyl ether forms thereof.

Preferred examples of the compound having an isocyanate include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate and blocked compounds thereof with an alcohol or an amine.

Preferred examples of the amine compound include ethylenediamine, diethylenetriamine, triethylenetetramine, hexamethylenediamine, propylenediamine and polyethylene-imine.

Preferred examples of the compound having a hydroxyl group include compounds having a terminal methylol, polyhydric alcohols such as pentaerythritol, bisphenols and polyphenols.

Preferred examples of the compound having a carboxyl group include aromatic polyhydric carboxylic acids such as pyromellitic acid, trimellitic acid and phthalic acid, and aliphatic polyhydric carboxylic acids such as adipic acid.

Preferred examples of the acid anhydride include pyromellitic acid anhydride and benzophenonetetracarboxylic acid anhydride.

In the lithographic printing plate precursor of the present invention, the compound having a thermally reactive group is preferably allowed to diffuse from the microcapsule and be present at least either on the surface thereof or in the vicinity of the surface, whereby the compound causes a chemical reaction by heat at the image formation and then the molecular structure in the image area of the heat-sensitive layer changes into a three-dimensional crosslinked form. As a result thereof, the solubility of the image area in water or an aqueous solution greatly differs between before and after the image formation and even after aging, the plate can exhibit good on-press developability. Furthermore, the microcapsule used has an outer wall which does not rupture by heat used for the image formation, therefore, even after the image formation, the microcapsule can be present as a particle in the image area and by virtue of this, the image area can have strong strength, as a result, a larger number of printed matters can be obtained. Incidentally, microcapsules having an outer wall which ruptures by heat generated at the time of image formation, are poor in the aging stability.

For allowing the compound having a thermally reactive group to diffuse from a microcapsule in the heat-sensitive layer and be present on the surface of the microcapsule and in the vicinity of the surface, for example, the microcapsules may be dispersed in a solvent which swells the outer wall of the microcapsule.

To this purpose, the material for the outer wall of the microcapsule for use in the present invention preferably has a three-dimensional crosslink and has properties of swelling by a solvent. In view of these, the wall material of the microcapsule is preferably polyurea, polyurethane, polyester, polycarbonate, polyamide or a mixture thereof, more preferably polyurea or polyurethane. Into the outer wall of the microcapsule, as described above, the compound having a thermally reactive group may be introduced.

For encapsulating the compound having a thermally reactive group, conventionally known encapsulation methods may be used. Examples of the method for producing a microcapsule include a method using coacervation described in U.S. Pat. Nos. 2,800,457 and 2,800,458, a method using interfacial polymerization methods described in British Patent 990,443, U.S. Pat. No. 3,287,154, JP-B-38-19574, JP-B-42-446 and JP-B-42-771, a method using polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,455, an in situ method using monomer polymerization described in JP-B-36-9168 and JP-A-51-9079, a spray drying method described in British Patent 930,422 and U.S. Pat. No. 3,111,407, and an electrolytic dispersion cooling method described in British Patents 952,807 and 965,074. However, the present invention is not limited thereto.

The solvent which swells the outer wall of the microcapsule depends on the microcapsule-dispersing solvent (called a solvent or a coating solution), the constructive material and wall thickness of the microcapsule wall, and the compound having a thermally reactive group contained in the microcapsule, however, the solvent may be easily selected from a large number of commercially available solvents. For example, in the case of a water-dispersible microcapsule comprising a crosslinked polyurea or polyurethane wall, preferred examples of the solvent include alcohols, ethers, acetals, esters, ketones, polyhydric alcohols, amides, amines and aliphatic acids.

Specific examples thereof include methanol, ethanol, tertiary butanol, n-propanol, tetrahydrofurane, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide, however, the present invention is not limited thereto. These solvents may be used in combination of two or more thereof.

A solvent which does not dissolve in the microcapsule-dispersing solvent but dissolves when mixed with the above-described solvent, may also be used.

The amount added of the solvent which swells the outer wall of the microcapsule is determined by the combination of raw materials, however, if the amount added is less than the optimum value, the image formation proceeds insufficiently, whereas if it exceeds the optimum value, the dispersion solution deteriorates in the stability. Usually, the amount of the solvent added is effectively from 5 to 95 wt %, preferably from 10 to 90 wt %, more preferably from 15 to 85 wt %, based on the coating solution.

For measuring the compound having a thermally reactive group, which is present on the microcapsule or in the vicinity thereof, conventional surface measurement techniques using X-ray photoelectric spectrometry (i.e., Electron Spectroscopy for Chemical Analysis: ESCA) may be used.

The microcapsule is added in an amount of preferably 50% by weigh or more, more preferably 60% by weight or more, based on the heat-sensitive layer.

If the amount of the microcapsule is less than 50% by weight, the press life is deteriorated.

[Microcapsule Having Outer Wall Capable of Rupturing by Heat]

The microcapsule for use in the present invention has an outer wall capable of rupturing by heat used for the image formation and contains a compound having a functional group capable of reacting by the heat (also called a thermally reactive group). The average particle size thereof is preferably from 0.01 to 20 μm, more preferably from 0.05 to 2.0 μm, most preferably from 0.06 to 0.40 μm. If the average particle size is excessively large, bad resolution results, whereas if it is too small, the aging stability changes for the worse.

The microcapsule may have a structure such that microcapsules can react with each other through a thermally reactive group of the above-described compound contained therein or in the case where a hydrophilic resin or a low molecular compound, which are described later, is contained as another additive in the heat-sensitive layer, the microcapsule may have a structure such that the microcapsule can react with the hydrophilic resin or low molecular compound. Also, thermally reactive groups capable of thermally reacting with each other may be introduced into two or more kinds of microcapsules to have a structure such that the microcapsules can react with each other. Examples of the reaction using this thermally reactive group include a polymerization reaction of an unsaturated group, an addition reaction of an isocyanate group or a block form thereof with a compound having an active hydrogen atom (for example, amine, alcohol and carboxylic acid), an addition reaction of an epoxy group with an amino group, a carboxyl group or a hydroxyl group, a condensation reaction of a carboxyl group with a hydroxyl group or an amino group, and a ring opening addition reaction of an acid anhydride with an amino group or a hydroxyl group. As long as a chemical bond can be formed, any of these reactions may be used.

The microcapsule containing a compound having the thermally reactive group may be obtained by a method of encapsulating a compound (which is described in detail later) having a thermally reactive group such as an acrylate group, a methacrylate group, a vinyl group, an allyl group, an epoxy group, an amino group, a hydroxyl group, a carboxyl group, an isocyanate, an acid anhydride or a protective group thereof, or introducing this compound into the outer wall of a microcapsule. At the same time with the encapsulation of the compound having a thermally reactive group, the compound may be introduced into the outer wall of the microcapsule.

Examples of the compound having a thermally reactive group, which can be encapsulated, include compounds having an unsaturated group. The compound having an unsaturated group is a radical polymerizable compound having at least one ethylenically unsaturated double bond, and selected from the compounds having at least one, preferably two or more ethylenically unsaturated terminal bonds. Such compounds are widely known in this industrial field and those known compounds all can be used in the present invention without any limit. This compound has a chemical form of, for example, monomer, prepolymer, more specifically, dimer, trimer or oligomer, a mixture thereof or a copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyhydric amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydration condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and substitution reaction products of an unsaturated carboxylic acid ester or amide having a splitting-off substituent such as halogen group or tosyloxy group with a monofunctional or polyfunctional alcohol, amine or thiol may also be suitably used. These compounds but where the unsaturated carboxylic acid is replaced by an unsaturated phosphonic acid, styrene or the like, may also be used.

Specific examples of the radical polymerizable compound which is an ester of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate and polyester acrylate oligomer;

- methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl] dimethylmethane and bis[p-(methacryloxyethoxy) phenyl]dimethylmethane;
- itaconic acid esters such as ethylene glycol diitaconate, propylene glycol diitaconate, 1,3-butanediol diitaconate, 1,4-butanediol duitaconate, tetramethylene glycol diitaconate, pentaerythritol diitaconate and sorbitol tetraitaconate;
- crotonic acid esters such as ethylene glycol dicrotonate, tetramethylene glycol dicrotonate, penta-erythritol dicrotonate and sorbitol tetradicrotonate;
- isocrotonic acid esters such as ethylene glycol diisocrotonate, pentaerythritol diisocrotonate and sorbitol tetraisocrotonate; and
- maleic acid esters such as ethylene glycol dimaleate, triethylene glycol dimaleate, pentaerythritol dimaleate and sorbitol tetramaleate.

Other examples of the ester include aliphatic alcohol-based esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetris-acrylamide, xylylenebisacrylamide and xylylenebis-methacrylamide.

Other preferred examples of the amide-type monomer include those having a cyclohexylene structure described in JP-B-54-21726.

A urethane-based addition polymerizable compound produced by using an addition reaction of isocyanate and a hydroxyl group may also be suitably used and specific examples thereof include vinyl urethane compounds having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

$$CH_2{=}C(R_{41})COOCH_2CH(R_{42})OH \qquad (A)$$

(wherein $R_{41}$ and $R_{42}$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used.

Furthermore, radical polymerizable compounds having an amino or sulfide structure within the molecule described in JP-A-63-277653, JP-A-63-260909 and JP-A-1-105238 may be used.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Nippon Secchaku Kyokaishi* (*Journal of Japan Adhesive Society*), Vol. 20, No. 7, pp. 300–308 (1984) may also be used.

Preferred examples of the epoxy compound include glycerin polyglycidyl ether, polyethylene glycol diglycidyl ether, polypropylene diglycidyl ether, trimethylol propane polyglycidyl ether, sorbitol polyglycidyl ether, bisphenols, polyphenols and hydrogenated products thereof, namely, polyglycidyl ether forms thereof.

Preferred examples of the compound having an isocyanate include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate and blocked compounds thereof with an alcohol or an amine. Preferred examples of the amine compound include ethylenediamine, diethylenetriamine, triethylenetetramine, hexamethylenediamine, propylenediamine and polyethylene-imine.

Preferred examples of the compound having a hydroxyl group include compounds having a terminal methylol, polyhydric alcohols such as pentaerythritol, bisphenols and polyphenols.

Preferred examples of the compound having a carboxyl group include aromatic polyhydric carboxylic acids such as pyromellitic acid, trimellitic acid and phthalic acid, and aliphatic polyhydric carboxylic acids such as adipic acid.

Preferred examples of the acid anhydride include pyromellitic acid anhydride and benzophenonetetracarboxylic acid anhydride.

In the lithographic printing plate precursor of the present invention, microcapsules containing the compound having a thermally reactive group are incorporated into the heat-sensitive layer, whereby the outer wall of the microcapsule ruptures by the heat at the time of image formation, the compound contained in the microcapsule is released into the heat-sensitive layer and causes a chemical reaction, and thereby the molecular structure in the image area of the heat-sensitive layer changes into a three-dimensional crosslinked form. As a result thereof, the solubility of the image area in water or an aqueous solution greatly differs between before and after the image formation, and good on-press developability can be exhibited. Furthermore, the microcapsule used has an outer wall which ruptures by heat used for the image formation, therefore, the compound can thermally react with the compound outside the microcapsule without fail and the crosslinking density of the three-dimensional crosslinked form is considered to be very high. By virtue of this, the image obtained after the image formation can have high strength and thereby, a larger number of printed matters can be obtained.

The material for the outer wall of the microcapsule for use in the present invention is preferably polyurea, polyurethane, polyester, polycarbonate, polyamide or a mixture thereof, more preferably polyurea or polyurethane. Into the outer wall of the microcapsule, as described above, the compound having a thermally reactive group may be introduced.

For encapsulating the compound having a thermally reactive group, conventionally known encapsulation methods may be used. Examples of the method for producing a microcapsule include a method using coacervation described in U.S. Pat. Nos. 2,800,457 and 2,800,458, a method using interfacial polymerization methods described in British Patent 990,443, U.S. Pat. No. 3,287,154, JP-B-38-19574, JP-B-42-446 and JP-B-42-771, a method using polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,455, an in situ method using monomer polymerization described in JP-B-36-9168 and JP-A-51-9079, a spray drying method described in British Patent 930,422 and U.S. Pat. No. 3,111,407, and an electrolytic dispersion cooling method described in British Patents 952,807 and 965,074. However, the present invention is not limited thereto.

The microcapsule is added in an amount of preferably 50% by weight or more, more preferably 60% by weight or more, based on the heat-sensitive layer.

If the amount of the microcapsule is less than 50% by weight, the press life is deteriorated.

[Light-to-heat Converting Material]

When a light-to-heat converting material is incorporated into the heat-sensitive layer or a layer adjacent thereto, the lithographic printing plate precursor of the present invention can perform writing of an image by the irradiation of a laser light or the like.

In the case where a microcapsule having an outer wall incapable of rupturing by heat used for the image formation is used in the heat-sensitive layer, the light-to-heat converting material is preferably contained within the microcapsule so as to attain effective use of the heat generated from the light-to-heat converting material. When the light-to-heat converting material is contained within the microcapsule, the elevation of heat occurs from the inside of the microcapsule, therefore, the heat can be effectively used for the permeation and bleeding out of the encapsulated substance through the outer wall of the microcapsule or for activating the reaction of the reactive substance, whereby the lithographic printing plate precursor of the present invention can be improved in the press life.

In the case where a microcapsule having an outer wall capable of rupturing by heat used for the image formation is used in the heat-sensitive layer, the light-to-heat converting material is preferably contained within the microcapsule so as to attain effective use of the heat generated from the light-to-heat converting material. When the light-to-heat converting material is contained within the microcapsule, the heat can be effectively used for the rupture of the outer wall of the microcapsule, release of the encapsulated substance, and activation of the reaction of the reactive substance, whereby the lithographic printing plate precursor of the present invention can be improved in the press life.

In the case where a microcapsule having an outer wall capable of rupturing by heat or a fine particulate polymer capable of combining by heat is used in the heat-sensitive layer, the light-to-heat converting material is preferably contained within the microcapsule or the fine particulate polymer so as to attain effective use of the heat generated from the light-to-heat converting material. When the light-to-heat converting material is contained within the microcapsule or fine particulate polymer, the heat can be effectively used for the rupture of the outer wall of the microcapsule, release of the encapsulated substance, and activation of the reaction of the reactive substance, whereby the lithographic printing plate precursor of the present invention can be improved in the press life.

The light-to-heat converting material is not particularly limited as long as it absorbs light in the wavelength region of the light source, and examples thereof include carbon black, fine particulate metal and dye. In particular, compounds which absorb infrared light and converts it into heat are preferred.

The light-to-heat converting material is particularly preferably a substance which absorbs light at 700 nm or more and various pigments and dyes can be used. Examples of the pigment which can be used include commercially available pigments and pigments described in *Color Index* (*C.I.*) *Binran* (*C.I. Handbook*), *Saishin Ganryo Binran* (*Handbook of Newest Pigments*), compiled by Nippon Ganryo Gijutsu Kyokai (1977), *Saishin Ganryo Oyo Gijutsu* (*Up-To-Date Pigment Application Technology*), CMC (1986), and *Insatsu Ink Gijutsu* (*Printing Ink Technology*), CMC (1984).

The kind of pigment includes black pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black.

These pigments may or may not be surface-treated before use. For the surface treatment, a method of coating a hydrophilic or lipophilic resin on the surface, a method of attaching a surfactant, and a method of bonding a reactive substance (for example, silica sol, alumina sol, silane coupling agent, epoxy compound or isocyanate compound) to the pigment surface may be used. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Up-To-Date Pigment Application Technology*), CMC (1986). Among these pigments, those which absorb infrared light or near infrared light are preferred because these are suitable for the use with a laser which emits infrared light or near infrared light.

Suitable examples of the pigment which absorbs infrared light or near infrared light include carbon pigment, hydrophilic resin-coated carbon black and silica sol-modified carbon black. Among these, carbon black having a surface coated with hydrophilic resin or silica sol is useful because of easy dispersibility in a water-soluble resin and freeness of impairment in the hydrophilicity.

The particle size of the pigment is preferably from 0.01 to 1 μm, more preferably from 0.01 to 0.5 μm. For dispersing the pigment, a known dispersion technique for use in the production of ink or toner may be used. Examples of the disperser include ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Up-To-Date Pigment Application Technology*), CMC (1986).

As the dye, commercially available dyes and known dyes described in publications (for example, *Senryo Binran* (*Handbook of Dyes*), compiled by Yuki Gosei Kagaku Kyokai (1970)) may be used. Specific examples thereof include dyes such as azo dye, metal complex salt azo dye, pyrazolone azo dye, anthraquinone dye, phthalocyanine dye, carbonium dye, quinoneimine dye, methine dye and cyanine dye. Among these dyes, those which absorb infrared light or near infrared light are preferred because these are suitable for the use with a laser which emits infrared or near infrared light.

Examples of the dye which absorbs infrared or near infrared light include cyanine dyes described in JP-A-58-125246, JP-A-59-84356, JP-A-60-78787, U.S. Pat. No. 4,973,572 and JP-A-10-268512, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, cyanine dyes described in British Patent 434,875, cyanine dyes described in U.S. Pat. No. 4,973,572, dyes described in JP-A-10-268512, and dyes represented by the following formulae (I) and (II) described in U.S. Pat. No. 4,756,993:

(I)

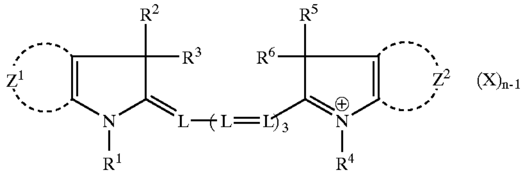

[wherein $R^1$, $R^2$, $R^3$, $R^4$, $R^5$ and $R^6$ each represents a substituted or unsubstituted alkyl group; $Z^1$ and $Z^2$ each represents a substituted or unsubstituted phenyl group or a naphthalene group; L represents a substituted or unsubstituted methine group, the substituent is an alkyl group having 8 or less carbon atoms, a halogen atom or an amino group or the methine group may contain a cyclohexene or cyclopentene ring which may have a substituent and which is formed resulting from the combining of substituents on two methine carbons with each other, and the substituent is an alkyl group having 6 or less carbon atoms or a halogen atom; X represents an anion; n is 1 or 2; and at least one of $R^1$, $R^2$, $R^3$, $R^4$, $R^5$, $R^6$, $Z^1$ and $Z^2$ represents a substituent having an acidic group or an alkali metal salt or amine salt of an acidic group];

(II)

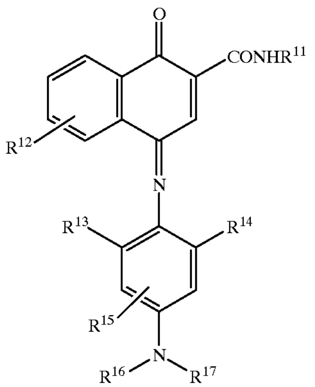

[wherein $R^{11}$ represents a substituted or unsubstituted alkyl group, a substituted or unsubstituted aryl group or a substituted or unsubstituted heterocyclic group; $R^{12}$ and $R^{15}$ each represents hydrogen atom or a group capable of substituting in place of hydrogen atom; $R^{13}$ and $R^{14}$ each represents hydrogen atom, a halogen atom, a substituted or unsubstituted alkoxy group or a substituted or unsubstituted alkyl group, provided that $R^{13}$ and $R^{14}$ are not simultaneously hydrogen atom; and $R^{16}$ and $R^{17}$ each represents a substituted or unsubstituted alkyl group, a substituted or unsubstituted aryl group, an acyl group or a sulfonyl group, or $R^{16}$ and $R^{17}$ may form a nonmetallic 5- or 6-membered ring].

As the dye, the near infrared absorbing sensitizers described in U.S. Pat. No. 5,156,938 may also be suitably used. In particular, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, pyrylium compounds described in JP-B-5-13514 and JP-B-5-19702, and Epolight III-178, Epolight III-130, Epolight and III-125 produced by Epolin are preferably used.

In the case of encapsulating the dye, in view of the synthesis, a dye soluble in a solvent incapable of mixing with water, more preferably soluble in ethyl acetate is preferred. Specific examples thereof include oil-soluble cyanine dyes containing an alkyl chain having 4 or more carbon atoms, oil-soluble phthalocyanine dyes and oil-soluble polymethine dyes.

Among these dyes, the water-soluble cyanine dye represented by formula (I) is particularly preferred.

Specific examples of the compound are set forth below.
(I-1)
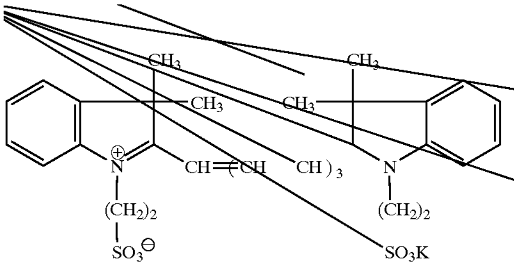
(I-2)
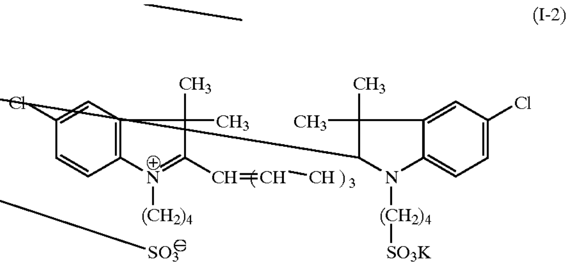
(I-3)
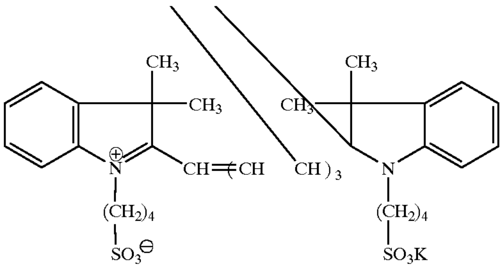
(I-4)
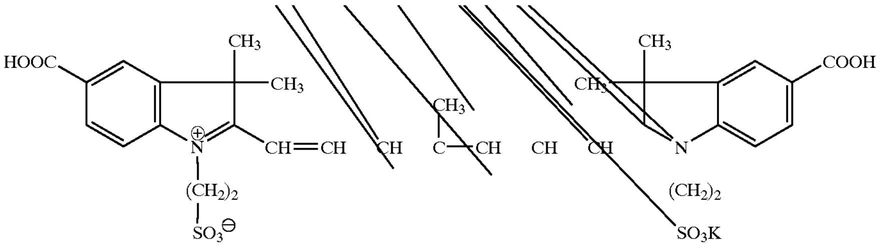
(I-5)
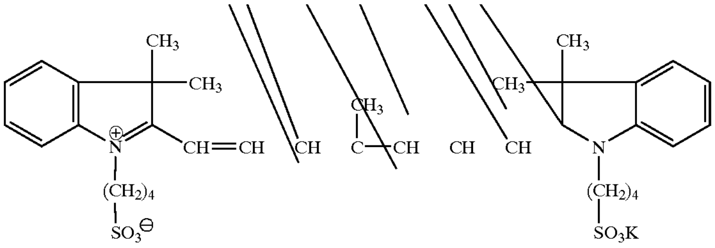
(I-6)
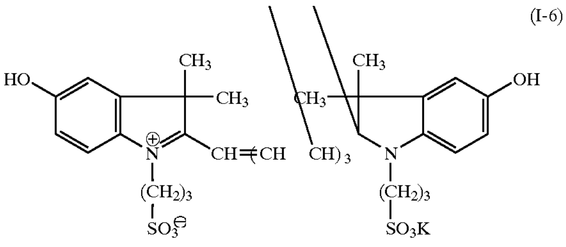
(I-7)
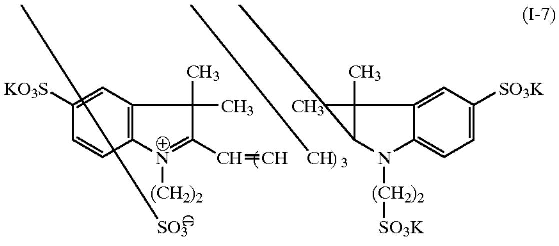
(I-8)
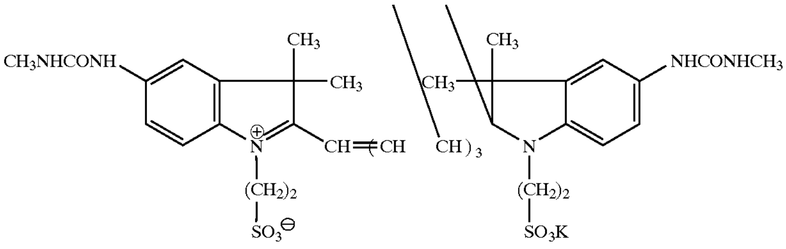

-continued
(I-9)
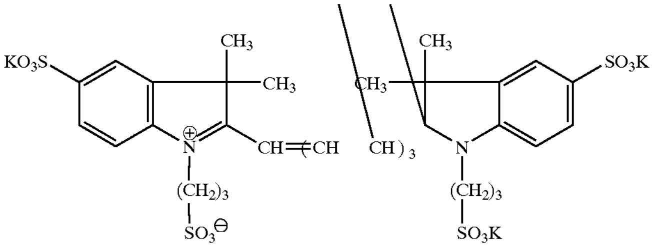
(I-10)
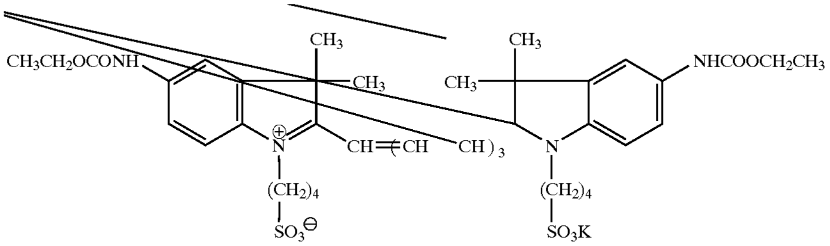
(I-11)
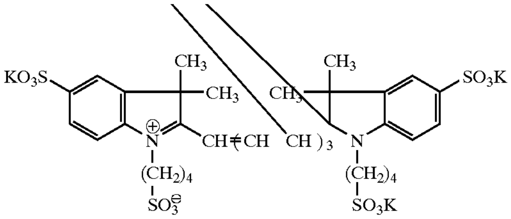
(I-12)
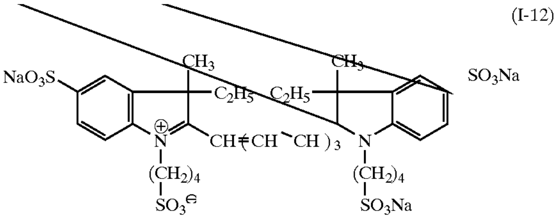
(I-13)
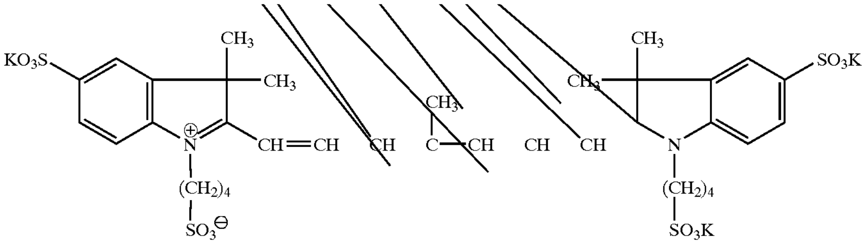
(I-14)
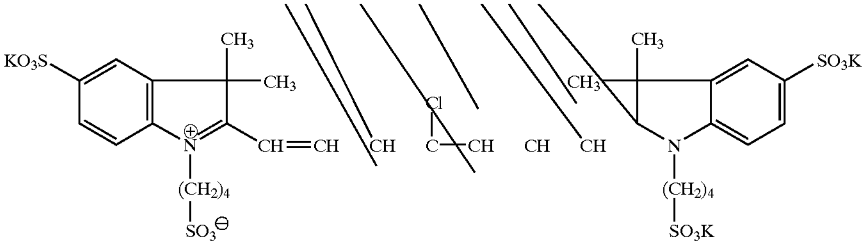
(I-15)
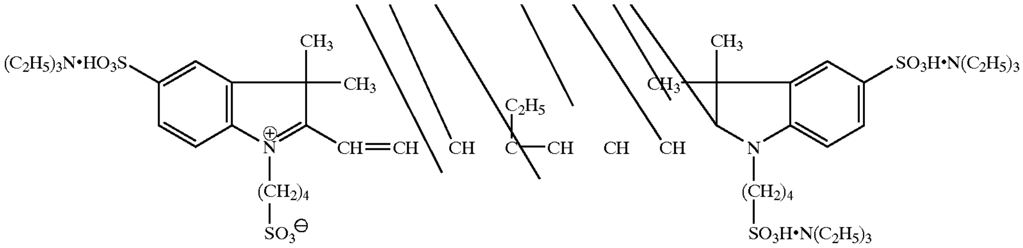
(I-16)
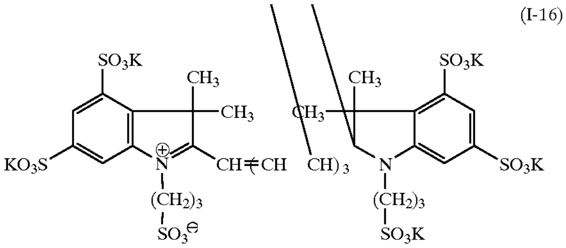
(I-17)
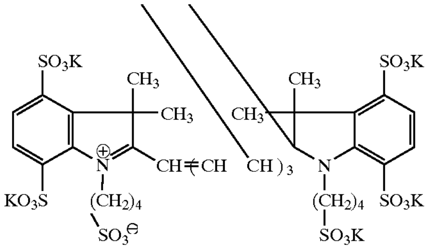

-continued
(I-18)
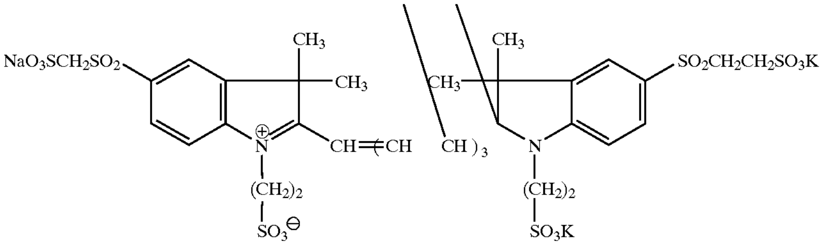
(I-19)
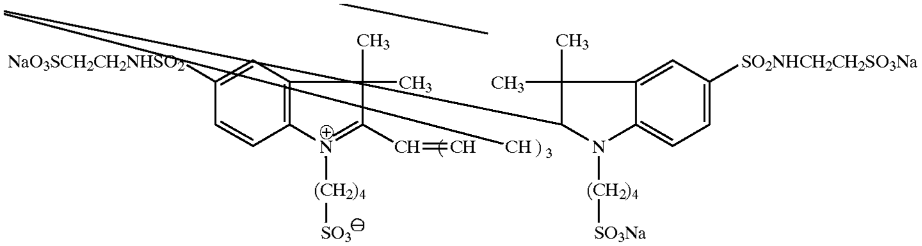
(I-20)
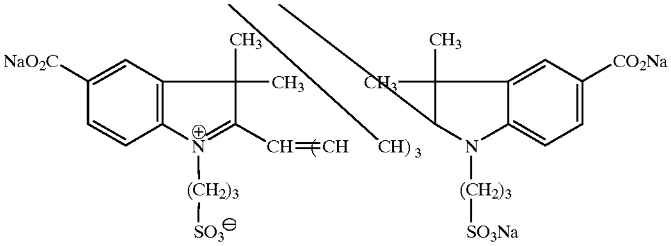
(I-21)
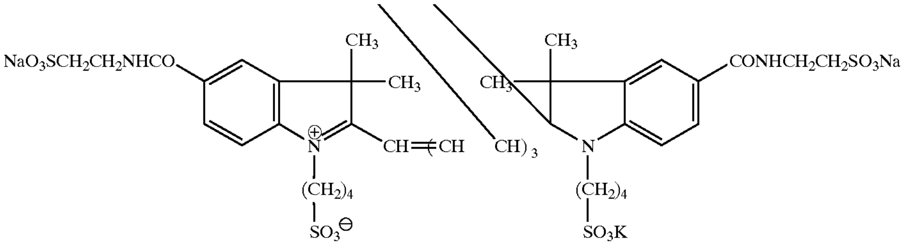
(I-22)
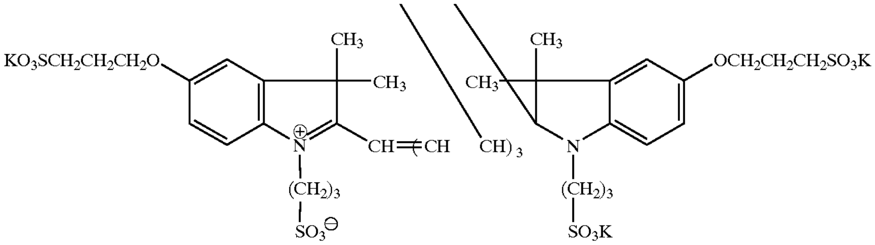
(I-23)
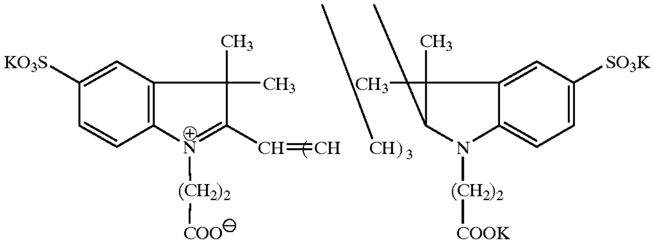
(I-24)
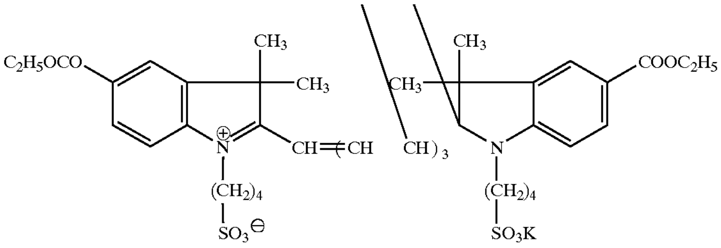

-continued
(I-25)
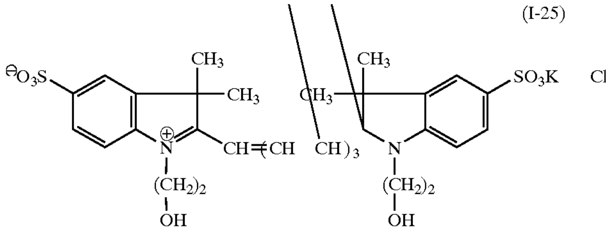
(I-26)
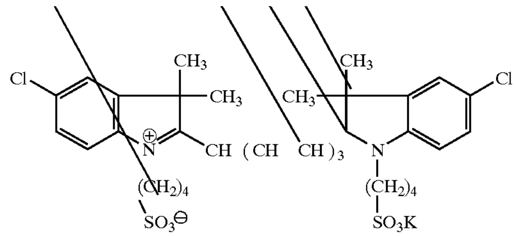
(I-27)
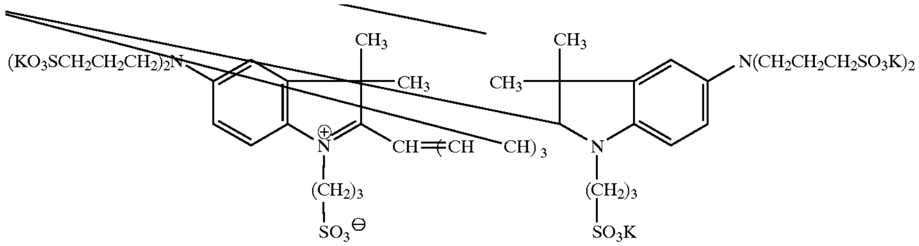
(I-28)
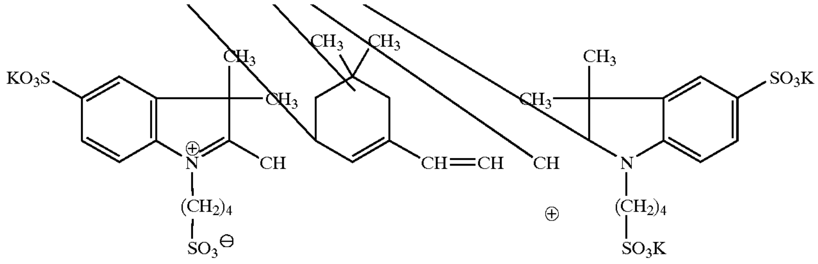
(I-29)
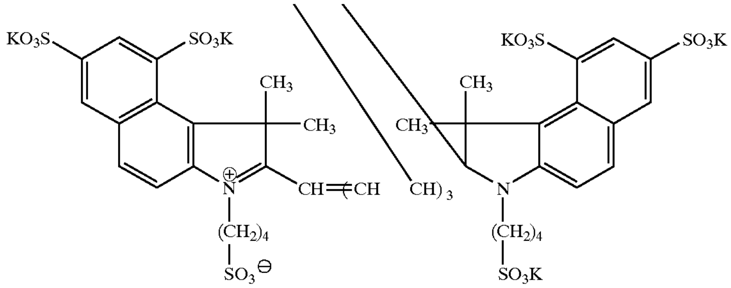
(I-30)
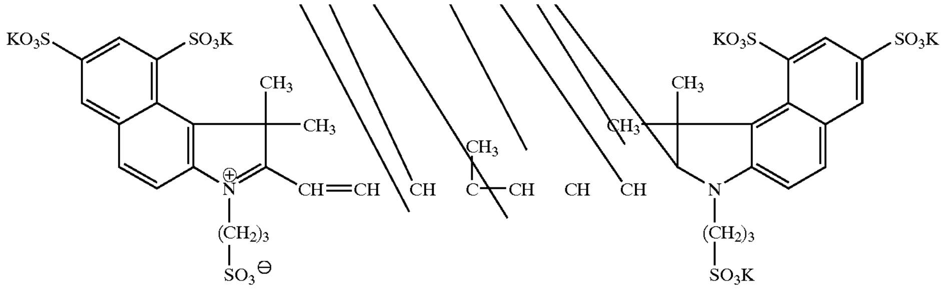
(I-31)
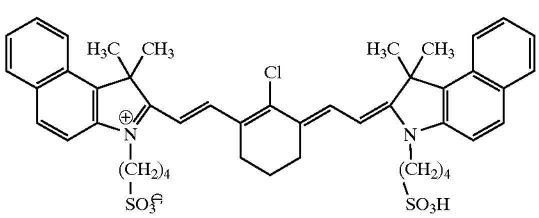
(I-32)
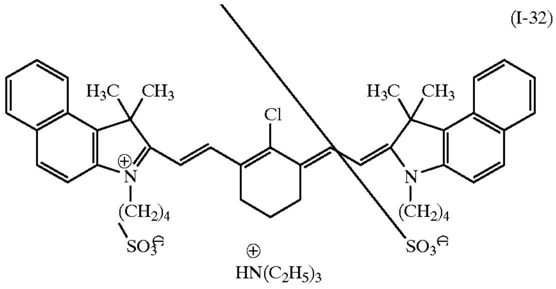

-continued (I-33)

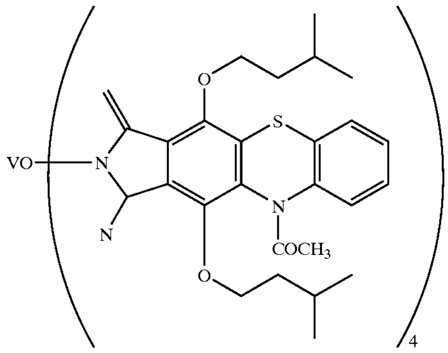

(I-34)

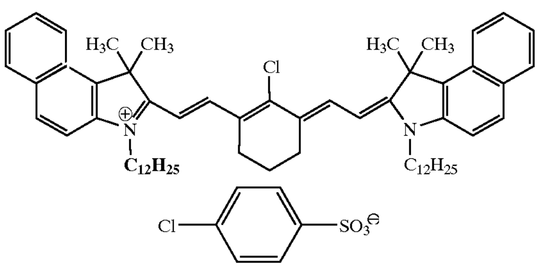

The light-to-heat converting fine particulate metal is described below. Many particulate metals are light-to-heat converting and self-exothermic.

Preferred examples of the fine particulate metal include fine particles of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re and Sb as a single metal or an alloy, and oxides and sulfides thereof.

Among these metals for constituting the fine particulate metal, preferred are metals having a melting point of 1,000° C. or less where heat fusion readily takes place upon irradiation of light, and having an absorption in the infrared, visible or ultraviolet region, such as Re, Sb, Te, Au, Ag, Cu, Ge, Pb and Sn.

Among these, more preferred are fine particles of metals having a relatively low melting point and exhibiting a relatively high absorbance for the heat ray, such as Ag, Au, Cu, Sb, Ge and Pb. Particularly preferred elements are Ag, Au and Cu.

The fine particulate metal may also consist of two or more light-to-heat converting substances, which is obtained, for example, by mixing fine particles of a low melting point metal such as Re, Sb, Te, Au, Ag, Cu, Ge, Pb and Sn, and fine particles of a self-exothermic metal such as Ti, Cr, Fe, Co, Ni, W and Ge. A combination use of fine pieces of a metal seed which exhibits particularly large light absorption in the form of fine piece, such as Ag, Pt and Pd, with other metal fine pieces is also preferred.

The effect of the present invention can be brought out when the fine particle of metal as a single metal or an alloy is subjected to a surface hydrophilizing treatment. For the hydrophilization, a surface treatment with a hydrophilic compound -having adsorptivity to the particle, for example, with a surfactant or a substance having a hydrophilic group reacting with a constitution substance of the particles, and a method of providing a protective colloidal hydrophilic polymer coating may be used. A surface silicate treatment is particularly preferred and for example, in the case of fine particulate iron, the surface can be fully hydrophilized by dipping the fine particulate iron in an aqueous sodium silicate (3%) solution at 70° C. for 30 seconds. Other fine particulate metals can be surface-treated with silicate in the same manner.

The average particle size of these particles is 10 μm or less, preferably from 0.003 to 5 μm, more preferably from 0.01 to 3 μm. As the particle size is smaller, the heat-fusion temperature decreases, in other words, the photosensitivity in the heat mode advantageously increases, but the particles become difficult to disperse. If the particle size exceeds 10 μm, the resolution of printed matter decreases.

In the present invention, when the light-to-heat converting material (infrared absorbent) is used, the amount added thereof is 1 wt % or more, preferably 2 wt % or more, more preferably 5 wt % or more, based on all solids content in the heat-sensitive layer (image recording layer). If the light-to-heat converting material content is less than 1 wt %, the sensitivity decreases.

[Hydrophilic Resin]

The heat-sensitive layer of the lithographic printing plate precursor of the present invention may contain a hydrophilic resin. By adding a hydrophilic resin, not only good on-press developability can be attained but also the film strength of the heat-sensitive layer itself increases. The hydrophilic resin is preferably not three-dimensionally crosslinked so as to ensure good on-press developability.

The hydrophilic resin preferably has a hydrophilic group such as hydroxyl, carboxyl, hydroxyethyl, hydroxypropyl, amino, aminoethyl, aminopropyl and carboxymethyl. Specific examples of the hydrophilic resin include gum arabic, casein, gelatin, starch derivatives, carboxymethyl cellulose and Na salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having,a hydrolysis degree of at least 60 wt %, preferably at least 80 wt %, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, and homopolymers and copolymers of 2-acrylamide-2-methylpropanesulfonic acid and salts thereof.

The amount of the hydrophilic resin added to the heat-sensitive layer is preferably from 2 to 40%, more preferably from 3 to 30%. If the amount added is less than 2%, the coating becomes low in the strength, whereas if it exceeds 40%, the press life deteriorates though the on-press developability is improved.

[Compound Which Initiates or Accelerates Reaction]

The heat-sensitive layer of the lithographic printing plate precursor of the present invention uses the above-described fine particulate polymer having a reactive group, or the microcapsule containing a compound having a thermally reactive group, therefore, if desired, a compound which initiates or accelerates the reaction of the polymer or microcapsule may be added. Examples thereof include compounds which generate radical or cation by heat, such as lophine dimers, trihalomethyl compounds, peroxides, azo compounds, onium salts containing diazonium salt or diphenyl iodonium salt, acylphosphine and imidosulfonate.

This compound may be added to the heat-sensitive layer in the range from 1 to 20 wt %, preferably from 3 to 10 wt %. If the amount added exceeds this range, the on-press developability changes for the worse, whereas if it is less than the range, the effect of initiating or accelerating the reaction decreases and the press life properties are deteriorated.

In the case of using a microcapsule, a compound which initiates or accelerates the reaction is preferably incorporated into the inside of microcapsule so as to attain efficient progress of the reaction. By incorporating the compound into the inside of the microcapsule, a previously well mixed state with the compound having a thermally reactive group can be provided and upon irradiation of a laser, the reaction can proceed along with the bleeding out or release of the encapsulated materials, whereby the lithographic printing plate precursor of the present invention can be more improved in the press life.

[(Low Molecular) Compound Which Reacts with Fine Particulate Polymer Capable of Combining or Incapable of Combining by Heat Used for Image Formation]

The heat-sensitive layer of the lithographic printing plate precursor of the present invention may further contain a (low molecular) compound having a functional group capable of reacting with the reactive group in the fine particulate polymer and a protective group thereof. The amount of this compound added is preferably from 5 to 40 wt %, more preferably from 5 to 20 wt %, based on the heat-sensitive layer. If the amount added thereof is less than this range, the effect by the crosslinking is not brought out and insufficient press life results, whereas if it exceeds the above-described range, the on-press developability changes for the worse after the aging. The compound which can be used is described below.

The (low molecular) compound includes compounds having an unsaturated group. The compound having an unsaturated group is a radical polymerizable compound having at least one ethylenically unsaturated double bond and the compound is selected from the compounds having at least one, preferably two or more ethylenically unsaturated terminal bonds. Such compounds are widely known in this industrial field and those known compounds all can be used in the present invention without any limit. This compound has, a chemical form of, for example, monomer, prepolymer, more specifically, dimer, trimer or oligomer, a mixture thereof or a copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyhydric amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydration condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and substitution reaction products of an unsaturated carboxylic acid ester or amide having an eliminating substituent such as halogen group or tosyloxy group with a monofunctional or polyfunctional alcohol, amine or thiol may also be suitably used. These compounds but where the unsaturated carboxylic acid is replaced by an unsaturated phosphonic acid, styrene or the like, may also be used.

Specific examples of the radical polymerizable compound which is an ester of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate and polyester acrylate oligomer;

- methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;
- itaconic acid esters such as ethylene glycol diitaconate, propylene glycol diitaconate, 1,3-butanediol diitaconate, 1,4-butanediol diitaconate, tetramethylene glycol diitaconate, pentaerythritol duitaconate and sorbitol tetraitaconate;
- crotonic acid esters such as ethylene glycol dicrotonate, tetramethylene glycol dicrotonate, penta-erythritol dicrotonate and sorbitol tetradicrotonate;
- isocrotonic acid esters such as ethylene glycol diisocrotonate, pentaerythritol diisocrotonate and sorbitol tetraisocrotonate; and
- maleic acid esters such as ethylene glycol dimaleate, triethylene glycol dimaleate, pentaerythritol dimaleate and sorbitol tetramaleate.

Other examples of the ester include aliphatic alcohol-based esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetris-acrylamide, xylylenebisacrylamide and xylylenebis-methacrylamide.

Other preferred examples of the amide-type monomer include those having a cyclohexylene structure described in JP-B-54-21726.

A urethane-based addition polymerizable compound produced by using an addition reaction of isocyanate and a hydroxyl group is also suitably used and specific examples thereof include vinyl urethane compounds having two or more polymerizable vinyl groups within one molecule described in JP-B-48-41708, which are obtained by adding a vinyl monomer having a hydroxyl group represented by the following formula (A) to a polyisocyanate compound having two or more isocyanate groups within one molecule:

$$CH_2{=}C(R_{41})COOCH_2CH(R_{42})OH \quad (A)$$

(wherein $R_{41}$ and $R_{42}$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used.

Furthermore, radical polymerizable compounds having an amino or sulfide structure within the molecule described in JP-A-63-277653, JP-A-63-260909 and JP-A-1-105238 may be used.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Nippon Secchaku Kyokaishi* (*Journal of Japan Adhesive Society*), Vol. 20, No. 7, pp. 300–308 (1984) may also be used.

Preferred examples of the epoxy compound include glycerin polyglycidyl ether, polyethylene glycol diglycidyl ether, polypropylene diglycidyl ether, trimethylol propane polyglycidyl ether, sorbitol polyglycidyl ether, bisphenols, polyphenols and hydrogenated products thereof, namely, polyglycidyl ether forms thereof.

Preferred examples of the compound having an isocyanate include tolylene diisocyanate, diphenylmethane diisocyanate, polymethylene polyphenyl polyisocyanate, xylylene diisocyanate, naphthalene diisocyanate, cyclohexane phenylene diisocyanate, isophorone diisocyanate, hexamethylene diisocyanate, cyclohexyl diisocyanate and blocked compounds thereof with an alcohol or an amine.

Preferred examples of the amine compound include ethylenediamine, diethylenetriamine, triethylenetetramine, hexamethylenediamine, propylenediamine and polyethylene-imine.

Preferred examples of the compound having a hydroxyl group include compounds having a terminal methylol, polyhydric alcohols such as pentaerythritol, bisphenols and polyphenols.

Preferred examples of the compound having a carboxyl group include aromatic polyhydric carboxylic acids such as pyromellitic acid, trimellitic acid and phthalic acid, and aliphatic polyhydric carboxylic acids such as adipic acid.

Preferred examples of the acid anhydride include pyromellitic acid anhydride and benzophenonetetracarboxylic acid anhydride.

[Low Molecular Compound Which Reacts with Compound having Thermally Reactive Group Contained in Microcapsule]

The heat-sensitive layer of the lithographic printing plate precursor of the present invention may further contain a low molecular compound having a functional group capable of reacting with a compound having a thermally reactive group contained in the microcapsule, by heat used for the image formation and a protective group thereof. The amount of this compound added is preferably from 5 to 40 wt %, more preferably from 5 to 20 wt %, based on the heat-sensitive layer. If the amount added is less than this range, the effect by the crosslinking is not brought out and insufficient press life results, whereas if it exceeds the above-described range, the on-press developability changes for the worse after the aging. Specific examples of this compound include those described above as the specific examples of the compound having a thermally reactive group contained in the microcapsule.

[Other Additives]

In the present invention, other than those described above, various compounds may further be added, if desired. For example, a dye having a large absorption in the visible light region may be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Kagaku Kogyo K. K.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-based pigments, azo-based pigments, carbon black and titanium oxide may be suitably used.

The colorant is preferably added so as to provide clear distinction between the image area and the non-image area after the image formation. The amount of the colorant added is from 0.01 to 10 wt % based on all solids content of the coating solution for the heat-sensitive layer.

In the present invention, a slight amount of a thermopolymerization inhibitor is preferably added so as to inhibit unnecessary thermopolymerization of the compound having an ethylenically unsaturated double bond capable of radical polymerization during preparation or storage of the coating composition for the heat-sensitive layer. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt. The amount of the thermopolymerization inhibitor added is preferably from about 0.01 wt % to about 5 wt % based on the weight of the entire composition. If desired, a higher fatty acid derivative such as behenic acid or behenic acid amide may be added and allowed to localize on the surface of the heat-sensitive layer in the process of drying after the coating so as to prevent polymerization inhibition by oxygen. The amount of the higher fatty acid derivative added is preferably from about 0.1 wt % to about 10 wt % based on the entire composition.

The composition for the heat-sensitive layer of the present invention may contain a nonionic surfactant described in JP-A-62-251740 and JP-A-3-208514 or an amphoteric surfactant described in JP-A-59-121044 and JP-A-4-13149 so as to broaden the processing stability against development conditions.

Specific examples of the nonionic surfactant include sorbitan tristearate, sorbitan monopalmitate, sorbitan trioleate, stearic acid monoglyceride and polyoxyethylenenonylphenyl ether.

Specific examples of the amphoteric surfactant include alkyldi(aminoethyl)glycine, alkylpolyaminoethyl glycine hydrochloride, 2-alkyl-N-carboxyethyl-N-hydroxyethyl-imidazolinium betaine and N-tetradecyl-N,N-betaine type (for example, AMORGEN K, trade name, produced by Daiichi Kogyo K. K.).

The ratio of the nonionic surfactant or amphoteric surfactant occupying in the coating composition for the heat-sensitive layer is preferably from 0.05 to 15 wt %, more preferably from 0.1 to 5 wt %.

The coating composition for the heat-sensitive layer of the present invention may further contain, if desired, a plasticizer for imparting flexibility to the coated film. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

The lithographic printing plate precursor of the present invention may be produced by dissolving the above-described components necessary for the coating solution for the heat-sensitive layer in a solvent and coating the obtained solution on an appropriate support. Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water, however, the present invention is not limited thereto. These solvents are used individually or in combination. The concentration of the above-described components (the entire solids content containing additives) in the solvent is preferably from 1 to 50 wt %.

The amount (solids content) coated of the heat-sensitive layer obtained on the support after the coating and drying varies depending on the use, however, in the case of a lithographic printing plate precursor in general, it is preferably from 0.5 to 5.0 g/m$^2$. The coating solution may be coated by various methods such as bar coater coating, rotation coating, spray coating, curtain coating, dip coating, air knife coating, blade coating and roll coating. As the amount coated is larger, the apparent sensitivity becomes higher, however, the heat-sensitive layer deteriorates in the properties of the coating necessary for the function of recording image.

The coating solution for the heat-sensitive layer according to the present invention may contain a surfactant so as to improve the coatability, such as a fluorine-containing surfactant described, for example, in JP-A-62-170950. The amount of the surfactant added is preferably from 0.01 to 1 wt %, more preferably from 0.05 to 0.5 wt %, based on the entire solids content of materials in the heat-sensitive layer.

[Overcoat Layer]

In the lithographic printing plate precursor of the present invention, a water-soluble overcoat layer may be provided on the heat-sensitive layer so as to prevent staining on the surface of the heat-sensitive layer due to lipophilic substances. The water-soluble overcoat layer for use in the present invention is a layer which can be easily removed at the printing, and contains a resin selected from water-soluble organic polymer compounds. The water-soluble organic polymer compound provides, when coated and dried, a coating having a film-forming ability. Specific examples thereof include polyvinyl acetate (having, however, a hydrolysis ratio of 65% or more), polyacrylic acid and alkali metal and amine salts thereof, polyacrylic acid copolymers and alkali metal and amine salts thereof, polymethacrylic acid and alkali metal and amine salts thereof, polymethacrylic acid copolymers and alkali metal and amine salts thereof, polyacrylamide and copolymers thereof, polyhydroxyethyl acrylate, polyvinylpyrrolidone and copolymers thereof, polyvinyl methyl ether, polyvinyl methyl ether/maleic acid anhydride copolymers, poly-2-acrylamide-2-methyl-1-propanesulfonic acid and alkali metal and amine salts thereof, poly-2-acrylamide-2-methyl-1-propanesulfonic acid-copolymers and alkali metal and amine salts thereof, gum arabic, cellulose derivatives (e.g., carboxymethyl cellulose, carboxyethyl cellulose, methyl cellulose) and modifications thereof, white dextrin, pullulan and enzymolysis etherified dextrin. According to the purpose, these resins can be used in combination of two or more thereof.

The overcoat layer may contain the above-described water-soluble light-to-heat converting agent. The overcoat layer may further contain, in the case of coating as an aqueous solution, a nonionic surfactant such as polyoxyethylenenonylphenyl ether and polyoxyethylenedodecyl ether, so as to ensure uniformity of the coating.

The overcoat layer preferably has a dry coated amount of 0.1 to 2.0 g/m$^2$. If the dry coated amount is less than this range, staining by attaching of a finger print may arise, whereas if it exceeds the above-described range, the on-press developability deteriorates.

[Support]

In the lithographic printing plate precursor of the present invention, the hydrophilic support where the heat-sensitive layer can be coated is a plate-like material having good dimensional stability and examples thereof include paper, paper laminated with plastic (e.g., polyethylene, polypropylene, polystyrene), metal plates (e.g., aluminum, zinc, copper), plastic film (e.g., cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal), and paper or plastic film having laminated or deposited thereon the above-described metal. Among these, a polyester film or an aluminum plate is preferred.

The support for use in the lithographic printing plate precursor of the present invention is preferably an aluminum plate which is lightweight and excellent in the surface-treating property, workability and corrosion resistance. Examples of the aluminum material used to this purpose include JIS 1050 material, JIS 1100 material, JIS 1070 material, Al—Mg system alloy, Al—Mn system alloy, Al—Mn—Mg system alloy, Al—Zr system alloy and Al—Mg—Si system alloy.

Well-known techniques related to the aluminum material which can be used for the support, are enumerated below.

(1) With respect to JIS 1050 material, the following techniques are disclosed:

JP-A-59-153861, JP-A-61-51395, JP-A-62-146694, JP-A-60-215725, JP-A-60-215726, JP-A-60-215727, JP-A-60-215728, JP-A-61-272357, JP-A-58-11759, JP-A-58-42493, JP-A-58-221254, JP-A-62-148295, JP-A-4-254545, JP-A-4-165041, JP-A-3-689393, JP-A-3-234594, JP-B-1-47545, JP-A-62-140894, JP-B-1-35910 and JP-B-55-28874.

(2) With respect to JIS 1070 material, the following techniques are disclosed:

JP-A-7-81264, JP-A-7-305133, JP-A-8-49034, JP-A-8-73974, JP-A-8-108659 and JP-A-8-92679.

(3) With respect to the Al—Mg system alloy, the following techniques are disclosed:

JP-B-62-5080, JP-B-63-60823, JP-B-3-61753, JP-A-60-203496, JP-A-60-203497, JP-B-3-11635, JP-A-61-274993, JP-A-62-23794, JP-A-63-47347, JP-A-63-47348, JP-A-63-47349, JP-A-64-61293, JP-A-63-135294, JP-A-63-87288, JP-B-4-73392, JP-B-7-100844, JP-A-62-149856, JP-B-4-73394, JP-A-62-182291, JP-B-5-76530, JP-A-63-30294, JP-B-6-37116, JP-A-2-215599 and JP-A-61-201747.

(4) With respect to the Al—Mn system alloy, the following techniques are disclosed:

JP-A-60-230951, JP-A-1-306288, JP-A-2-293189, JP-B-54-42284, JP-B-4-19290, JP-B-4-19291, JP-B-4-19292, JP-A-61-35995, JP-A-64-51992, U.S. Pat. Nos. 5,009,722 and 5,028,276 and JP-A-4-226394.

(5) With respect to the Al—Mn—Mg system alloy, the following techniques are disclosed:

JP-A-62-86143, JP-A-3-222796, JP-B-63-60824, JP-A-60-63346, JP-A-60-63347, EP223737, JP-A-1-283350, U.S. Pat. No. 4,818,300 and British Patent 1,222,777.

(6) With respect to the Al—Zr system alloy, the following techniques are disclosed:

JP-A-63-15978, JP-A-61-51395, JP-A-63-143234 and JP-A-63-143235.

(7) With respect to the Al—Mg—Si system alloy, British Patent 1,421,710 is known.

With respect to the production method of the aluminum plate for support, the following methods may be used.

A molten metal of aluminum alloy containing the above-described components and alloy component ratio is subjected to a cleaning treatment by an ordinary method and then cast. In the cleaning treatment, for removing unnecessary gas such as a hydrogen gas in the molten metal, a flux treatment, a degassing treatment using Ar gas or Cl gas, filtering using a so-called rigid media filter such as ceramic tube filter and ceramic form filter, a filter using alumina flake or alumina ball as the filter medium, or a glass cloth filter, or a treatment using a combination of degassing and filtering, is performed. This cleaning treatment is preferably performed so as to prevent occurrence of defects due to foreign matters in the molten metal, such as nonmetallic inclusion or oxide, or defects due to gas dissolved in the molten metal.

The techniques on filtering of the molten metal are known in JP-A-6-57342, JP-A-3-162530, JP-A-5-140659, JP-A-4-231425, JP-A-4-276031, JP-A-5-311261 and JP-A-6-136466.

The techniques on degassing of the molten metal are known in JP-A-5-51659, JP-A-5-51660, JP-U-A-5-49148 and JP-A-7-40017.

The molten metal thus subjected to a cleaning treatment is then cast. The casting method includes a method using a fixed mold, represented by DC casting, and a method using a driving mold, represented by continuous casting.

In the case of using DC casting, the molten metal is solidified at a cooling rate of 1 to 300° C./sec. If the cooling rate is less than 1° C./sec., a large number of coarse intermetallic compounds are formed.

Examples of the continuous casting which is used in industry include a Hunter method, a method using a cold roll, represented by 3C method, a Hazelett method, and a method using cooling belt or cooling block, represented by Alusuisse Caster II. In the case of using continuous casting, the molten metal is solidified at a cooling rate of 100 to 1,000° C./sec. In general, the cooling rate is high as compared with DC casting and therefore, the solid solubility of the alloy components based on the aluminum matrix can be elevated. The continuous casting method is disclosed by the present inventors in JP-A-3-79798, JP-A-5-201166, JP-A-5-156414, JP-A-6-262203, JP-A-6-122949, JP-A-6-210406 and JP-A-6-262308.

In the case of performing DC casting, an ingot having a plate thickness of 300 to 800 nm is produced. This ingot is scalped by an ordinary method to cut from 1 to 30 mm, preferably from 1 to 10 mm, of the surface layer. Thereafter, the plate is soaked, if desired. In the soaking treatment, a heat treatment is performed at 450 to 620° C. for 1 to 48 hours so as not to cause coarsening of the intermetallic compound. If the treating time is less than 1 hour, the effect attained by the soaking treatment is insufficient. Subsequently, the aluminum plate is hot-rolled and then cold-rolled to obtain an aluminum rolled plate. The temperature at the initiation of hot rolling is in the range from 350 to 500° C. Before, after or during the cold rolling, intermediate annealing may be applied. The intermediate annealing is performed under heating conditions of, in the case of using a batch-system annealing furnace, 280 to 600° C. for 2 to 20 hours, preferably 350 to 500° C. for 2 to 10 hours, or in the case of using a continues annealing furnace, 400 to 600° C. for 360 seconds or less, preferably 450 to 550° C. for 120 seconds or less. By using a continuous annealing furnace and elevating the heating temperature at a rate of 10° C./sec or more, the crystal structure may be made fine.

The Al plate finished to a predetermined thickness of 0.1 to 0.5 mm through the above-described steps may be improved in the planeness by a sizing apparatus such as roller leveler and tension leveler. The improvement of planeness may be performed after cutting the plate into a sheet form but in order to elevating the productivity, the improvement of planeness is preferably performed while the plate is in a continuous coil state. For the working to a predetermined plate width, the Al plate is usually passed through slitter line. On the edge face cut by the slitter, one or both of sheared surface and ruptured surface are generated at the cutting by the slitter blade.

The plate thickness accuracy is suitably within ±10 $\mu$m, preferably within ±6 $\mu$m, over the entire coil length. The plate thickness difference in the width direction is suitably within 6 $\mu$m, preferably within 3 $\mu$m. The plate width accuracy is suitably within ±1.0 mm, preferably within ±0.5 mm. The surface roughness of the Al plate is readily affected by the surface roughness of the roller, but the Al plate is preferably finished to finally have a center line (average) surface roughness (Ra) of approximately from 0.1 to 1.0 $\mu$m. If the Ra is excessively large, the original roughness of Al, namely, rolled streaks transferred from the roller, is viewed through the heat-sensitive layer after a lithographic printing plate is completed by the roughening treatment and coating of the heat-sensitive layer and this is not preferred in view of appearance. On the other hand, if Ra is less than 0.1 $\mu$m, the surface of the roller must be finished to have excessively low roughness and this is industrially disadvantageous.

In order to prevent generation of scratches due to friction between Al plates, a thin oil film may be provided on the surface of the Al plate. For the oil film, a volatile material or an nonvolatile material is appropriately used according to the purpose. If the oil amount is excessively large, slipping failure may occur in the production line, whereas if the oil amount is nil, troubles such as generation of scratches take place during the transportation of coils. Accordingly, the amount is suitably from 3 to 100 mg/$m^2$. The upper limit thereof is preferably 50 $mg/m^2$ or less, more preferably 10 $mg/m^2$ or less. With respect to the cold rolling, details are disclosed in JP-A-6-210308.

In the case of performing continuous casting, for example, when a cooling roller by the Hunter method is used, a cast plate having a thickness of 1 to 10 mm can be directly and continuously cast and rolled and the hot-rolling step can be advantageously dispensed with. When a cooling roller by the Hazelett method is used, a cast plate having a thickness of 10 to 50 mm can be cast and in general, by disposing a hot-rolling roller immediately after the casting and continuously rolling the plate, a continuously cast and rolled plate having a thickness of 1 to 10 mm can be obtained. These continuously cast and rolled plates are, in the same manner as described in the case of DC casting, subjected to cold rolling, intermediate annealing, improvement of planeness, slitting and the like and finished to a plate thickness of 0.1 to 0.5 mm. The intermediate annealing conditions and cold rolling conditions in the case of using a continuous casting method are described in JP-A-6-220593, JP-A-6-210308, JP-A-7-54111 and JP-A-8-92709.

The thus-produced Al plate is subjected to a surface treatment such as roughening of the surface, and then a heat-sensitive layer is coated thereon, thereby producing a lithographic printing plate precursor. The surface roughening treatment is performed using mechanical roughening, chemical roughening and electrochemical roughening individually or in combination. Furthermore, it is preferred to perform an anodization treatment to ensure resistance against scratches on the surface or to perform a treatment for increasing the hydrophilicity.

The surface treatment of the support is described below.

In advance of the surface roughening, the aluminum plate may be subjected, if desired, to a degreasing treatment, for example, with a surfactant, an organic solvent or an alkaline aqueous solution, so as to remove the rolling oil on the surface. In the case of using an alkaline aqueous solution, a treatment with an acidic solution may be performed to effect neutralization and desmutting.

Thereafter, a so-called graining treatment is performed, where the support surface is roughened so as to attain good adhesion between the support and the heat-sensitive layer and at the same time to impart water receptivity to the non-image area. To speak specifically, the means for this graining treatment includes a mechanical graining method such as sand blast, ball graining, wire graining, brush graining by nylon brush and abrasive/water slurry, and horning of colliding abrasive/water slurry to the surface under high pressure, and a chemical graining method of roughening the surface with an etching agent comprising an alkali, an acid or a mixture thereof. In addition, an electrochemical graining method described in British Patent 896,563, JP-A-53-67507, JP-A-54-146234 and JP-B-48-28123, a method using a combination of mechanical graining and an electrochemical graining described in JP-A-53-123204 and JP-A-54-63902, and a method using a combination of mechanical graining and chemical graining with a saturated aqueous solution containing mineral acid and aluminum salt described in JP-A-56-55261, are known. Furthermore, the surface may be roughened by a method of adhering granular materials using an adhesive or means having the adhesive effect to the support material or by press-contacting a continuous belt or roller having fine asperities to the support material and transferring the asperities.

A plurality of these surface roughening methods may be used in combination, and the order, repetition number and the like can be freely selected. In the case of using a plurality of surface roughening treatments in combination, a chemical treatment with an acid or alkali aqueous solution may be interposed between respective treatments so as to ensure uniform treatment of the subsequent surface roughening treatment. Specific examples of the acid or alkali aqueous solution include an aqueous solution of acid such as hydrofluoric acid, fluorozirconate, phosphoric acid, sulfuric acid, hydrochloric acid and nitric acid, and an aqueous solution of alkali such as sodium hydroxide, sodium silicate and sodium carbonate. These acid or alkali aqueous solutions can be used individually or in combination of two or more thereof. In general, the chemical treatment is performed using a 0.05 to 40 wt % aqueous solution of the above-described acid or alkali at a liquid temperature of 40 to 100° C. for 5 to 300 seconds.

On the surface of the support subjected to the above-described surface roughening treatment, namely, graining, smuts are generated, therefore, for removing the smuts, the support is in general preferably washed with water or subjected to a treatment such as alkali etching. Examples of this treatment include alkali etching described in JP-B-48-28123 and desmutting with sulfuric acid described in JP-A-53-12739.

In the case of the aluminum support for use in the present invention, after the above-described pretreatment is applied, an anodized oxide film is usually formed on the support by anodization so as to improve abrasion resistance, chemical resistance and water receptivity.

The electrolyte for use in the anodization treatment of the aluminum plate may be any as long as it forms, a porous anodized oxide film. In general, sulfuric acid, phosphoric acid, oxalic acid, chromic acid or a mixed acid thereof is used. The concentration of the electrolyte is appropriately determined depending on the kind of the electrolyte. The conditions for anodization treatment vary depending on the electrolyte used and cannot be indiscriminately specified, however, the conditions in general are suitably such that the concentration of electrolyte is from 1 to 80% solution, the liquid temperature is from 5 to 70° C., the current density is from 5 to 60 $A/dm^2$, the voltage is from 1 to 100 V, and the electrolysis time is from 10 seconds to 5 minutes. The amount of the anodized film is suitably 1.0 $g/m^2$ or more, preferably from 2.0 to 6.0 $g/m^2$. If the anodized film is less than 1.0 $g/m^2$, insufficient press life results or the non-image area of the lithographic printing plate is readily scratched and so-called "scratch staining" due to attachment of ink to the scratched portion is liable to occur at the printing.

The anodization treatment is applied to the surface of the support for a lithographic printing plate precursor, which surface is used for printing, but by extending the electric force line over the back surface, an anodized film of 0.01 to 3 $g/m^2$ is generally formed on the back surface. Also, an anodization treatment in an alkali aqueous solution (for example, an aqueous solution containing a few % of sodium hydroxide) or a molten salt, or an anodization treatment of forming a non-porous anodized film using, for example, an aqueous ammonium borate solution may be performed.

Before the anodization, a hydrous oxide film described in JP-A-4-148991 and JP-A-4-87896 may be formed or a treatment in metal silicate solution described in JP-A-63-56497 and JP-A-63-67295, a hydrous oxide film-forming treatment, or a chemical formation film-forming treatment described in JP-A-56-144195 may be performed.

After the anodization treatment, the aluminum support for use in the lithographic printing plate precursor of the present invention may be treated with an organic acid or a salt thereof, or use the organic acid or a salt thereof as an undercoat layer for the coating of the heat-sensitive layer. Examples of the organic acid or a salt thereof include organocarboxylic acid, organophosphonic acid, organosulfonic acid and salts thereof, with organocarboxylic acid and salts thereof being preferred. Examples of the organocarboxylic acid include aliphatic monocarboxylic acids such as formic acid, acetic acid, propionic acid, butyric acid, lauric acid, palmitic acid and stearic acid; unsaturated aliphatic monocarboxylic acids such as oleic acid and linoleic acid; aliphatic dicarboxylic acids such as oxalic acid, succinic acid, adipic acid and maleic acid; oxycarboxylic acids such as lactic acid, gluconic acid, malic acid, tartaric acid and citric acid; aromatic carboxylic acids such as benzoic acid, mandelic acid, salicylic acid and phthalic acid; and metal salts belonging to Groups Ia, IIb, IIIb, IVa, IVb and VIII, and ammonium salts. Among these organic carboxylates, preferred are the metal salts and ammonium salts of formic acid, acetic acid, butyric acid, propionic acid, lauric acid, oleic acid, succinic acid and benzoic acid. These compounds may be used individually or in combination of two or more thereof.

This compound is preferably dissolved in an alcohol to have a concentration of 0.001 to 10 wt %, more preferably from 0.01 to 1.0 wt %. In the treatment, the support is dipped in the treating solution under the conditions such that the temperature is from 25 to 95° C., preferably from 50 to 95° C., the pH is from 1 to 13, preferably from 2 to 10, for from 10 seconds to 20 minutes, preferably from 10 seconds to 3 minutes, or the treating solution is coated on the support.

Also, after the anodization, the support may be treated with a solution containing the following compound or may use the compound as an undercoat layer for the coating of the heat-sensitive layer. Examples of the compound which can be suitably used include organophosphonic acids such as phenylphosphonic acid, naphthyl-phosphonic acid, alkylphosphonic acid, glycerophosphonic acid, methylenediphosphonic acid and ethylenediphosphonic acid, which may have a substituent; organophosphoric acids such as phenylphosphoric acid, naphthylphosphoric acid, alkylphosphoric acid and glycerophosphoric acid, which may have a substituent; organophosphinic acids such as phenylphosphinic acid, naphthylphosphinic acid, alkylphosphinic acid and glycerophosphinic acid, which may have a substituent; amino acids such as glycine, β-alanine, valine, serine, threonine, aspartic acid, glutamic acid, arginine, lysine, tryptophan, parahydroxyphenyl glycine, dihydroxyethyl glycine and anthranilic acid; aminosulfonic acids such as sulfamic acid and cyclohexylsulfamic acid; and aminophosphonic acids such as 1-aminomethylphosphonic acid, 1-dimethylaminoethylphosphonic acid, 2-aminoethylphosphonic acid, 2-aminopropylphosphonic acid, 4-aminophenylphosphonic acid, 1-aminoethane-1,1-diphosphonic acid, 1-amino-1-phenylmethane-1,1-diphosphonic acid, 1-dimethylaminoethane-1,1-diphosphonic acid, 1-dimethylamino-butane-1,1-diphosphonic acid and ethylenediamine-tetramethylenephosphonic acid.

Furthermore, salts of hydrochloric acid, sulfuric acid, nitric acid, sulfonic acid (e.g., methanesulfonic acid) or oxalic acid with alkali metal, ammonia, lower alkanolamine (e.g., triethanolamine) or lower alkylamine (e.g., triethylamine) may also be suitably used.

In addition, water-soluble polymers such as polyacrylamide, polyvinyl alcohol, polyvinylpyrrolidone, polyethyleneimine and mineral acid salts thereof, poly(meth)acrylic acid and metal salts thereof, polystyrenesulfonic acid and metal salts thereof, alkyl (meth)acrylate, 2-acrylamide-2-methyl-1-propanesulfonic acid and metal salts thereof, trialkylammoniummethylstyrene chloride polymers and copolymers thereof with (meth)acrylic acid, and polyvinylphosphonic acid, may also be suitably used.

Also, soluble starch, carboxymethyl cellulose, dextrin, hydroxyethyl cellulose, gum arabic, guar gum, sodium alginate, gelatin, glucose and sorbitol may be suitably used. These compounds may be used either individually or in combination of two or more thereof.

In the case of a treatment, this compound is preferably dissolved in water and/or methyl alcohol to have a concentration of 0.001 to 10 wt %, more preferably from 0.01 to 1.0 wt %. The treatment is performed by dipping the support in the treating solution under the conditions such that the temperature is from 25 to 95° C., preferably from 50 to 95° C., the pH is from 1 to 13, preferably from 2 to 10, for from 10 seconds to 20 minutes, preferably from 10 seconds to 3 minutes.

In the case of using the compound as an undercoat layer for the coating of the heat-sensitive layer, the compound is similarly dissolved in water and/or methyl alcohol to have a concentration of 0.001 to 10 wt %, preferably from 0.01 to 1.0 wt %, and if desired, after adjusting the pH with a basic substance such as ammonia, triethylamine and potassium hydroxide, or an acidic substance such as hydrochloric acid and phosphoric acid, the solution may be used at a pH of 1 to 12. In order to improve the tone reproducibility of the lithographic printing plate precursor, a yellow dye may also be added. After the drying, the coverage of the organic undercoat layer is suitably from 2 to 200 $mg/m^2$, preferably from 5 to 100 $mg/M^2$. If the coverage is less than 2 $mg/m^2$, a sufficiently high effect is not obtained on the prevention of staining, which is the original purpose, whereas if it exceeds 200 $mg/m^2$, the impression capability decreases.

In order to increase the adhesion between the support and the heat-sensitive layer, an interlayer may be provided. In order to increase the adhesion, the interlayer generally comprises diazo resin or a phosphoric acid compound capable of adsorbing, for example, to aluminum. The thickness of the interlayer may be freely selected but must be sufficiently large to attain a uniform bond-forming reaction with the heat-sensitive layer as the upper layer when exposed. Usually, the coating ratio is, in terms of dry solid, from about 1 to 100 $mg/m^2$, more preferably from 5 to 40 $mg/m^2$. The ratio of diazo resin used in the interlayer is from 30 to 100%, preferably from 60 to 100%.

Before the above-described treatment or formation of an undercoat layer, the anodized and then water washed support may be subjected to the following treatments so as to prevent the anodized film from dissolving in the developer or fountain solution, to prevent the heat-sensitive layer components from remaining in the film, to improve the strength of the anodized film, to improve the hydrophilicity of the anodized film or to improve the adhesion to the heat-sensitive layer.

One of these treatments is a silicate treatment of treating the support by contacting the anodized film with an aqueous alkali metal silicate solution. In this case, the anodized film is contacted with an aqueous solution having an alkali metal silicate concentration of 0.1 to 30 wt %, preferably from 0.5 to 15 wt %, and having a pH at 25° C. of 10 to 13.5, at a temperature of 5 to 80° C., preferably from 10 to 70° C., more preferably from 15 to 50° C., for 0.5 to 120 seconds. The contacting may be made by any method such as dipping or spraying. If the pH is less than 10, the aqueous alkali metal silicate solution is gelled, whereas if the pH exceeds 13.5, the anodized film dissolves.

Examples of the alkali metal silicate for use in the present invention include sodium silicate, potassium silicate and lithium silicate. Examples of the hydroxide for use in adjusting the pH of the aqueous alkali metal silicate solution include sodium hydroxide, potassium hydroxide and lithium hydroxide. In the above-described treating solution, an alkaline earth metal salt or a Group IVb metal salt may be blended. Examples of the alkaline earth metal salt include nitrates such as calcium nitrate, strontium nitrate, magnesium nitrate and barium nitrate, and water-soluble salts such as sulfate, hydrochloride, phosphate, acetate, oxalate and borate. Examples of the Group IVb metal salt include titanium tetrachloride, titanium trichloride, potassium titanium fluoride, potassium titanium oxalate, titanium sulfate, titanium tetraiodide and zirconium chloride oxide. The alkaline earth metals and Group IVb metal salts may be used individually or in combination of two or more thereof. The metal salt is preferably used in an amount of 0.01 to 10 wt %, more preferably from 0.05 to 5.0 wt %.

Other than these, various sealing treatments may be used and in general, water vapor sealing, boiling water (hot water) sealing, metal salt sealing (e.g., chromate/bichromate sealing, nickel acetate sealing), oil and fat impregnation sealing, synthetic resin sealing, low-temperature sealing (with red prussiate or alkaline earth salt), known as a sealing treatment of anodized film, may be used. In view of the performance (adhesion with heat-sensitive layer or hydrophilicity) as the support of a printing plate, high-speed treatment, low cost and low pollution, water vapor sealing is relatively preferred. Examples of the method therefor include a method of continuously or discontinuously contacting water vapor with anodized film under applied pressure or atmospheric pressure at a relative humidity of 70% or more and water vapor temperature of 95° C. or more for approximately 2 to 180 seconds. Other examples of the sealing treatment include a method where the support is dipped in or sprayed with hot water or an aqueous alkali solution at a temperature on the order of 80 to 100° C. or in place of this treatment or in subsequent thereto, the support is dipped in or sprayed with a nitrite solution. Examples of the nitrite include nitrites and ammonium salts thereof, namely, ammonium salts and nitrite, of metals belonging to Groups Ia, IIa, IIb, IIIb, IVb, IVa, VIa, VIIa and VIII of the periodic table. Preferred examples of the metal salt include $LiO_2$, $NaNO_2$, $KNO_2$, $Mg(NO_2)_2$, $Ca(NO_2)_2$, $Zn(NO_3)_2$, $Al(NO_2)_3$, $Zr(NO_2)_4$, $Sn(NO_2)_3$, $Cr(NO_2)_3$, $Co(NO_2)_2$, $Mn(NO_2)_2$ and $Ni(NO_2)_2$. Among these, more preferred are alkali metal nitrites. The nitrites can be used in combination of two or more thereof.

The treating conditions vary depending on the state of the support and the kind of the alkali metal and cannot be indiscriminately determined, however, for example, in the case of using sodium nitrite, the alkali conditions may be selected within the range such that the concentration is generally from 0.001 to 10 wt %, preferably from 0.01 to 2 wt %, the bath temperature is generally from room temperature to about 100° C., preferably from 60 to 90° C., and the treating time is generally from 15 to 300 seconds, preferably from 10 to 180 seconds. The pH of the aqueous nitrite solution is preferably adjusted to 8.0 to 11.0, more preferably 8.5 to 9.5. The pH of the aqueous nitrite solution can be suitably adjusted to the above-described range using, for example, an alkali buffer solution. The alkali buffer solution is not particularly limited, however, for example, a mixed aqueous solution of sodium hydrogen-carbonate and sodium hydroxide, a mixed aqueous solution of sodium carbonate and sodium hydroxide, a mixed aqueous solution of sodium carbonate and sodium hydrogencarbonate, a mixed aqueous solution of sodium chloride and sodium hydroxide, a mixed aqueous solution of hydrochloric acid and sodium carbonate, a mixed aqueous solution of sodium tetraborate and sodium hydroxide and the like may be suitably used. For the alkali buffer solution, an alkali metal salt other than sodium salt, for example, potassium salt may also be used.

After the above-described silicate treatment or sealing treatment is applied, the support may be subjected to a treatment with an acidic aqueous solution or an application of a hydrophilic undercoat disclosed in JP-A-5-278362, or to a treatment of providing an organic layer disclosed in JP-A-4-282637 and JP-A-7-314937, so as to increase the adhesion to the heat-sensitive layer.

After the support surface is subjected to these treatments or undercoating, a back coat is applied, if desired, to the back surface of the support. The back coat is preferably a coating layer comprising a metal oxide obtained by hydrolyzing and polycondensing an organic polymer compound described in JP-A-5-45885 and an organic or inorganic metal compound described in JP-A-6-35174. Among these coating layers, those comprising a metal oxide obtained from an alkoxy compound of silicon such as $Si(OCH_3)_4$, $Si(OC_2H_5)_4$, $Si(OC_3H_7)_4$ and $Si(OC_4H_9)_4$, are preferred because these alkoxy compounds of silicon are inexpensive and easily available and the coating layer can have excellent resistance against developer.

With respect to the preferred properties of support for the lithographic printing plate precursor, the center line average roughness is from 0.10 to 1.2 μm. If this roughness is less than 0.10 μm, the adhesive property with the heat-sensitive layer decreases and the press life is seriously reduced, whereas if it exceeds 1.2 μm, the resistance against staining at the printing deteriorates. The color density of the support is, in terms of reflection density value, from 0.15 to 0.65. If the color is white in excess of 0.15, the halation is excessively intensified at the image exposure and causes troubles in the image formation, whereas if the color is black in excess of 0.65, the image can be hardly viewed at the plate inspection operation after the development and conspicuously low suitability for plate inspection results.

The lithographic printing plate precursor of the present invention can have more excellent on-press developability by using an aluminum substrate subjected to surface roughening and then anodization as the support. In this case, an aluminum substrate subjected further to a silicate treatment is more preferred.

On the aluminum substrate for use in the printing plate precursor of the present invention, a water-insoluble hydrophilic layer or a hydrophilic layer which generates heat upon laser exposure and at the same time is insoluble in water may be provided. Or, after a heat-insulating layer comprising an organic polymer is provided on the aluminum substrate so as to impart heat-insulating property, the above-described water-insoluble hydrophilic layer or hydrophilic layer which generates heat upon laser exposure and at the same time is insoluble in water, may be provided For example, a hydrophilic layer comprising silica fine particles and a hydrophilic resin may be provided on the aluminum substrate. Furthermore, by introducing a light-to-heat converting material described above into this hydrophilic layer, the layer can work as an exothermic hydrophilic layer. By virtue of this construction, not only the heat is prevented from easily escaping into the aluminum substrate but also the substrate can be used as a hydrophilic substrate capable of generating heat upon laser exposure. Furthermore, when an interlayer comprising an organic polymer is provided between the hydrophilic layer and the aluminum substrate, the heat can be more successfully prevented from escaping into the aluminum support. In view of the on-press developability, the support is preferably not porous and if a hydrophilic organic polymer material is contained in a proportion as high as 40% or more, the support swells with water and disadvantageously encounters difficulties in the clearing of ink.

The hydrophilic layer for use in the present invention is three-dimensionally crosslinked and incapable of dissolving in the fountain solution at the lithographic printing using water and/or ink. This layer preferably comprises the following colloid, that is, a colloid comprising a sol-gel converting system of an oxide or hydroxide of beryllium, magnesium, aluminum, silicon, titanium, boron, germanium, tin, zirconium, iron, vanadium, antimony or a transition metal. Depending on the case, the colloid may comprise a composite of these elements. In the colloid, the element forms a network structure through oxygen atom and at the same time, non-bonded hydroxyl group and alkoxy group are present and interspersed in the structure. From the initial hydrolysis condensation stage where active alkoxy group and hydroxyl group occupy a large proportion, with the progress of the reaction, the colloid increases in the particle size and becomes inactive. The colloid particles generally have a particle size of 2 to 500 nm and in the case of silica, spherical particles having a particle size of 5 to 100 nm are preferred in the present invention. Like aluminum colloid, feather-like particles of 100×10 nm are also effective.

Furthermore, a pearl neck-like colloid where spherical particles having a particle size of 10 to 50 nm are connected to a length of 50 to 400 nm may also be used.

The colloid may be used by itself or may be used in mixture with a hydrophilic resin. In order to accelerate the crosslinking, a crosslinking agent for colloid may be added.

Usually, the colloid is stabilized by a stabilizer in many cases. In the case of a cationically charged colloid, a compound having an anionic group is added as the stabilizer, and in the case of an anionically charged colloid, a compound having a cationic group is used. For example, silicon colloid is anionically charged, therefore, an amine-based compound is added as the stabilizer, and the aluminum colloid is cationically charged, therefore, a strong acid such as hydrochloric acid or acetic aid is added. When this colloid is coated on a substrate, a transparent film is formed at an ordinary temperature in many cases, however, only with the evaporation of the solvent of colloid, gelling insufficiently completes. By heating the colloid to a temperature where the stabilizer can be removed, firm three-dimensional crosslinking takes place and a hydrophilic layer preferred in the present invention can be formed.

Without using the above-described stabilizer, a hydrolysis condensation reaction may be performed directly from the starting material (e.g., di- tri- and/or tetra-alkoxysilane) to provide an appropriate sol state, and the sol may be coated as it is on a substrate and dried to complete the reaction. In this case, the three-dimensional crosslinking can be accomplished at a lower temperature than in the case of adding a stabilizer.

In addition, a colloid obtained by dispersing and stabilizing an appropriate hydrolysis condensation reactant in an organic solvent is also suitably used in the present invention. In this case, only with evaporation of the solvent, a three-dimensionally crosslinked film can be obtained. When the solvent is selected from low boiling point solvents such as methanol, ethanol, propanol, butanol, ethylene glycol monomethyl ether, ethylene glycol monoethyl ether and methyl ethyl ketone, the drying can be achieved at an ordinary temperature. In particular, colloids using a methanol or ethanol solvent are useful in the present invention because curing at a low temperature is facilitated.

The hydrophilic resin which is used together with the colloid is preferably a resin having a hydrophilic group such as hydroxyl, carboxyl, hydroxyethyl, hydroxypropyl, amino, aminoethyl, aminopropyl and carboxymethyl. Specific examples of the hydrophilic resin include gum arabic, casein, gelatin, starch derivatives, carboxymethyl cellulose and Na salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60 wt %, preferably at least 80 wt %, polyvinyl formal, polyvinyl butyral, polyvinyl pyrrolidone, homopolymers and copolymers of acrylamide, homopolymers and copolymers of methacrylamide, homopolymers and copolymers of N-methylolacrylamide, and homopolymers and copolymers of 2-acrylamide-2-methylpropanesulfonic acid and salts thereof.

The hydrophilic resin is more preferably a water-insoluble hydroxyl group-containing polymer and specific examples thereof include homopolymers and copolymers of hydroxyethyl methacrylate, and copolymers of hydroxyethyl acrylate.

The hydrophilic resin is used together with the colloid and the added ratio is, in the case where the hydrophilic resin is soluble in water, preferably 40 wt % or less based on all solids content in the hydrophilic layer and in the case where the hydrophilic resin is not soluble in water, preferably 20 wt % or less based on all solids content.

The hydrophilic resin may be used as it is but for the purpose of increasing the impression capability at the printing, a crosslinking agent for hydrophilic resin except for colloid may be added. Examples of the crosslinking agent for the hydrophilic resin include initial hydrolysis condensates of formaldehyde, glyoxal, polyisocyanate and tetraalkoxysilane, dimethylol urea and hexamethylolmelamine.

The hydrophilic layer of the present invention may contain a crosslinking agent of accelerating the crosslinking of the colloid in addition to the oxide or hydroxide colloid and the hydrophilic resin. This crosslinking agent is preferably initial hydrolysis condensate of tetraalkoxysilane, trialkoxysilylpropyl-N,N,N-trialkylammonium halide, or aminopropyltrialkoxy-silane. The added ratio thereof is preferably 5 wt % or less based on all solids content in the hydrophilic layer.

The hydrophilic layer of the present invention may further contain a hydrophilic light-to-heat converting material so as to increase heat sensitivity. The light-to-heat converting material is preferably a water-soluble infrared absorbing dye, and the cyanine dye having a sulfonic acid group or an alkali metal salt or amine salt group of sulfonic acid represented by formula (I) can be used to this purpose. The ratio of this dye added is from 1 to 20 wt %, preferably from 5 to 15 wt %, based on the entire amount of the hydrophilic layer.

In the present invention, the three-dimensionally crosslinked hydrophilic layer coated preferably has a thickness of 0.1 to 10 μm, preferably from 0.5 to 5 μm. If the thickness is excessively small, the hydrophilic layer has poor durability and the impression capability at the printing decreases, whereas if it is too large, the resolution decreases.

The interlayer comprising an organic polymer is described below. The organic polymer which can be used in the interlayer may be any organic polymer commonly used, such as polyurethane resin, polyester resin, acrylic resin, cresol resin, resol resin, polyvinyl acetal resin and vinyl resin. The amount coated thereof is preferably from 0.1 to 5.0 g/$m^2$. If the amount coated is less than 0.1 g/$m^2$, the heat-insulating effect is low, whereas if it exceeds 5.0 g/$m^2$, the press life in the non-image area deteriorates.

The lithographic printing plate precursor of the present invention can form an image by the exposure with a high output laser, however, a writing machine such as thermal head may also be used. In the present invention, a laser of emitting light in the infrared or near infrared region is preferred, and a laser diode of emitting light in the near infrared region is more preferred.

In this case, when a microcapsule is used in the heat-sensitive layer and the outer wall of the microcapsule is capable of rupturing by the heat used for the image formation, the exposure must be performed with an energy amount sufficiently large to rupture the outer wall.

In the case of not rupturing the outer wall of the capsule by the heat used for the image formation, the exposure must be performed with an energy not to cause rupturing of the outer wall.

As such, the lithographic printing plate precursor of the present invention can be manufactured. This lithographic printing plate precursor can perform the recording with an infrared laser.

The recording may be thermally made using an ultraviolet lamp or a thermal head, however, in the present invention, the image exposure is preferably performed using a solid laser or semiconductor laser capable of radiating an infrared light at the wavelength of 760 to 1,200 nm. The laser output is preferably 100 mW or more and in order to shorten the exposure time, a multi-beam laser device is preferably used. The exposure time is preferably 20μ seconds or less per one picture element. The energy irradiated on the recording material is preferably from 10 to 300 mJ/$cm^2$.

The thus exposed plate is fixed to a cylinder of the printing machine without passing through any processing. Using this fixed plate, the printing can be performed by the following procedures.

(1) A method of supplying fountain solution to the printing plate and after the development on the press, further supplying ink to start the printing.

(2) A method of supplying fountain solution and ink to the printing plate and after the development on the press, starting the printing.

(3) A method of supplying ink to the plate and simultaneously with the supply of fountain solution, feeding paper to start printing.

Also, as described in Japanese Patent No. 2938398, the plate may be fixed to the cylinder of the printing machine, exposed by a laser mounted on the printing machine, and developed on the press by applying fountain solution and/or ink thereto. The plate is preferably developable with water or an aqueous solution or capable of fixing to the printing machine as it is without passing through development and being used for the printing.

EXAMPLES

The present invention is described in greater detail below by referring to the Examples, however, the present invention should not be construed as being limited thereto.

Examples I-1 to I-7 and Comparative Examples I-1 to I-3

Preparation of Support (1) (Preparation of Aluminum Support)

A molten metal of JIS A01505 alloy containing 99.5% or more aluminum, 0.30% of Fe, 0.10% of Si, 0.02% of Ti and 0.013% of Cu was subjected to a cleaning treatment and then cast. In the cleaning treatment, the molten metal was subjected to a degassing treatment and then to a ceramic tube filter treatment, for removing unnecessary gas such as a hydrogen gas. The casting was performed by the DC casting method. The solidified ingot having a plate thickness of 500 nm was scalped to 10 mm from the surface, subjected to a homogenization treatment at 550° C. for 10 hours so as to prevent the intermetallic compound from becoming coarse. Subsequently, the plate was hot-rolled at 400° C., intermediate-annealed at 500° C. for 60 seconds in a continuous annealing furnace and then cold-rolled to obtain an aluminum rolled plate having a thickness of 0.30 mm. By controlling the roughness of the roller, the center line average surface roughness (Ra) after the cold rolling was controlled to 0.2 μm. Thereafter, the plate was applied with a tension leveler to improve the planeness.

Subsequently, the plate was surface-treated to obtain a support for a lithographic printing plate.

The plate was degreased with an aqueous 10% sodium aluminate at 50° C. for 30 seconds to remove the rolling oil on the aluminum plate surface and then treated for neutralization and desmutting with an aqueous 30% sulfuric solution at 50° C. for 30 seconds.

Then, the aluminum plate was subjected to a so-called graining treatment of roughening the support surface so as to attain good adhesion between the support and the heat-sensitive layer and at the same time to impart water receptivity to the non-image area. While keeping an aqueous solution containing 1% of nitric acid and 0.5% of aluminum nitrate at 45° C. and passing the aluminum web through the aqueous solution, the electrolytic graining was performed by applying an alternation-wave electric current at a current density of 20 A/$dm^2$ and a duty ratio of 1.1 to a quantity of electricity of 240 C/$dm^2$ in the anode side from an indirect power supply cell. Thereafter, the plate was etched with an aqueous 10% sodium aluminate solution at 50° C. for 30 seconds and then. treated with an aqueous 30% sulfuric acid solution for neutralization and desmutting at 50° C. for 30 seconds (Aluminum Substrate A).

In order to improve the abrasion resistance, chemical resistance and water receptivity, an oxide film was formed on the support by anodization. An aqueous 20% sulfuric acid solution at 35° C. was used as the electrolyte and while transporting the aluminum web through the electrolyte, the electrolytic treatment was performed with a d.c. current at 14 A/$dm^2$ from an indirect power supply cell to form an anodic oxide film of 2.5 g/$m^2$ (Aluminum Substrate B)

Thereafter, in order to ensure the hydrophilicity in the non-image area of the printing plate, the substrate was treated with silicate. In the treatment, while keeping an aqueous 1.5% No. 3 sodium silicate solution (i.e., sodium tetrasilicate solution) at 70° C., the aluminum web was transported therethrough such that the contact time was 15 seconds, and then washed with water. The amount of Si attached was 10 mg/$m^2$. The thus-prepared support had Ra (center line average surface roughness) of 0.25 μm (Aluminum Substrate C).

Preparation of Support (2) (Preparation of Support Comprising Aluminum Substrate having provided thereon Exothermic Hydrophilic Layer):

In 240 g of methanol, 45.2 g of methanol silica sol (produced by Nissan Chemical, a colloid comprising a methanol solution containing 30 wt % of silica particles of 10 to 20 nm), 1.52 g of poly-2-hydroxyethyl methacrylate and 3.2 g of infrared absorbing dye (I-32) were dissolved. The resulting solution was coated on Aluminum Substrate C by bar coating and dried in an oven at 100° C. for 30 seconds. The amount coated was 1.0 g/m$^2$.

Preparation of Support (3) (Preparation of Support Comprising Aluminum Substrate having provided thereon Heat-insulating Layer and further provided thereon Exothermic Hydrophilic Layer):

Coating of Heat-insulating Layer

In 100 g of methyl ethyl ketone and 90 g of methyl lactate, 10 g of polyvinyl butyral resin was dissolved. The resulting solution was coated on Aluminum Substrate C by bar coating and dried in an oven at 100° C. for 1 minute. The amount coated was 0.5 g/m$^2$.

Coating of Exothermic Hydrophilic Layer

In 240 g of methanol, 45.2 g of methanol silica sol, 1.52 g of poly-2-hydroxyethyl methacrylate and 3.2 g of infrared absorbing dye (I-32) were dissolved. The resulting solution was coated on the previously provided heat-insulating layer by bar coating and dried in an oven at 100° C. for 30 seconds. The amount coated was 1.0 g/m$^2$.

Synthesis of Fine Particulate Polymer Capable of Combining by Heat

Synthesis (1) of Fine Particulate Polymer Capable of Combining by Heat

To a reaction system, 2.0 g of glycidyl methacrylate, 13.0 g of methyl methacrylate and 200 ml of an aqueous polyoxyethylene phenol solution (concentration: 9.8x10$^{-3}$ mol/liter) were added, and while stirring at 250 rpm, the inside of the system was purged with nitrogen gas. The resulting solution was adjusted to 25° C. and thereto 10 ml of an aqueous cerium(IV) ammonium salt solution (concentration: 0.984x10$^{-3}$ mol/liter) was added. At this time, an aqueous ammonium nitrate solution (concentration: 58.8x10$^{-3}$ mol/liter) was added to adjust the pH to 1.3 to 1.4. Thereafter, the solution was stirred for 8 hours. The thus-obtained solution had a solids concentration of 9.5% and an average particle size of 0.4 μm.

Synthesis (2) of Fine Particulate Polymer Capable of Combining by Heat 7.5 g of allyl methacrylate and 7.5 g of styrene were polymerized in the same manner. The thus-obtained solution had a solids concentration of 9.5% and an average particle size of 0.4 μm.

Synthesis (3) of Fine Particulate Polymer Capable of Combining by Heat

In a solution containing 12.0 g of ethyl acetate and 6.0 of methyl ethyl ketone, 6.5 of Epicoat 1007 (Yuka Shell Epoxy K.K.), 1.0 g of light-to-heat converting material (I-34) and 0.1 g of an anion surfactant ("Pionine A41C" produced by Takemoto Yushi K.K.) were dissolved. The resulting solution was added to 36 g of 4% aqueous solution of PVA 205 (Kuraray Co., Lt.) and then emulsion-dispersed by homogenizer at 15,000 rpm for 15 minutes.

Therefore, further the dispersed solution was heated at 60° C. and stirred for 90 minutes, and then a solvent in the solution was evaluated to obtain a fine particle polymer having an average particle size of 0.20 μm and a solids concentration of 18.0%.

Synthesis (4) of Fine Particulate Polymer (Comparative Example) (not having a Reactive Group)

15 g of styrene was polymerized in the same manner. The thus-obtained solution had a solids concentration of 9.0% and an average particle size of 0.3 μm.

Coating of Heat-sensitive Layer

Coating solutions each having the following composition containing the heat-fusible fine particulate polymer of Synthesis Example (1), (2) (3) or (4) were prepared and coated on Support (1), (2) or (3) prepared above to form a heat-sensitive layer.

Composition of Coating Solution for Heat-sensitive Layer

| | |
|---|---|
| Water | 100 g |
| Fine Particulate Polymer (1), (2), (3) or (4) synthesized above (in terms of solids content) | 5 g |
| Polyhydroxyethyl acrylate (weight average molecular weight: 25,000) | 0.5 g |
| Infrared Absorbing Dye (I-32) | 0.3 g |

The coating solution was bar-coated and then dried in an oven at 80° C. for 120 seconds. The coated amount was 0.5 g/M$^2$.

The thus-obtained lithographic printing plate capable of on-press development was exposed in Trendsetter 3244VFS manufactured by Creo, on which a water cooling 40 W infrared semiconductor laser was mounted, under the conditions such that the output was 9 W, the rotation number of the outer drum was 210 rpm, the plate surface energy was 100 mJ/cm$^2$ and the resolution was 2,400 dpi. Thereafter, without passing through development, the plate was fixed to a cylinder of a printing machine Heidelberg SOR-M and by supplying fountain solution, then supplying ink and further feeding paper, printing was performed. All plates could be on-press developed without any problem and used for printing. The number of sheets of the printed matter obtained with each plate is shown in Table I-1 below.

TABLE I-1

| | Support | Heat-Sensitive Layer | Number of Printable Sheets |
|---|---|---|---|
| Example I-1 | (1) | Fine Particulate Polymer (1) | 5,000 |
| Example I-2 | (2) | Fine Particulate Polymer (1) | 10,000 |
| Example I-3 | (3) | Fine Particulate Polymer (1) | 15,000 |
| Example I-4 | (1) | Fine Particulate Polymer (2) | 3,000 |
| Example I-5 | (2) | Fine Particulate Polymer (2) | 6,000 |
| Example I-6 | (3) | Fine Particulate Polymer (2) | 10,000 |
| Example I-7 | (1) | Fine Particulate Polymer (3) | 20,000 |
| Comparative Example I-1 | (1) | Fine Particulate Polymer (4) | 1,000 |
| Comparative Example I-2 | (2) | Fine Particulate Polymer (4) | 1,500 |
| Comparative Example I-3 | (3) | Fine Particulate Polymer (4) | 2,000 |

As seen from the results above, the press life is better with the fine particulate polymer having a reactive group. Also, the press life is better with the support comprising an aluminum substrate having provided thereon an exothermic hydrophilic layer or the support comprising an aluminum substrate having provided thereon a heat-insulating layer and further provided thereon an exothermic hydrophilic layer.

Example I-8

A coating solution for the heat-sensitive layer comprising the following composition was coated on Support (3).

| | |
|---|---|
| Water | 100 g |
| Fine Particulate Polymer (2) synthesized above (in terms of solids content) | 5 g |
| Polyacrylic acid (weight average molecular weight: 25,000) | 0.5 g |
| Sorbitol triacrylate | 1.0 g |
| Infrared Absorbing Dye (I-31) | 0.3 g |

The thus-obtained plate was exposed and used for printing in the same manner as in Example I-1 to I-7, as a result, 20,000 sheets could be printed without any abnormality.

Example I-9

A coating solution for the heat-sensitive layer comprising the following composition was coated on Support (3).

| | |
|---|---|
| Water | 100 g |
| Fine Particulate Polymer (1) synthesized above (in terms of solids content) | 5 g |
| Polyacrylic acid (weight average molecular weight: 25,000) | 0.5 g |
| Diethylenetriamine | 1.0 g |
| Infrared Absorbing Dye (I-31) | 0.3 g |

The thus-obtained plate was exposed in Luxel T-9000CTP manufactured by Fuji Photo Film Co., Ltd., on which a multi-channel laser head was mounted, under the conditions that the output was 250 mW per 1 beam, the rotation number of the outer drum was 800 rpm and the resolution was 2,400 dpi. Using this plate, printing was performed in the same manner as in Example I-1 to I-7, as a result, 30,000 sheets could be printed without any abnormality.

Examples I-10 to I-12

Lithographic printing plate precursors were prepared, image exposed and used for printing in the same manner as in Example I-1 except for using Aluminum Substrates A to C obtained in the Preparation of Support (1), and then evaluated on the on-press developability.

The on-press developability was evaluated by examining how large % the shadow part of a halftone image of 150 lines/inch on the 100th printed matter from the initiation of printing could be reproduced and as the value obtained was higher, the on-press developability was evaluated more excellent.

The results obtained are shown in Table I-2 below.

TABLE I-2

Resistance against Staining at Printing

| | Aluminum Substrate | Reproducibility of Shadow Part (%) |
|---|---|---|
| Example I-10 | Aluminum Substrate A | 90 |
| Example I-11 | Aluminum Substrate B | 95 |
| Example I-12 | Aluminum Substrate C | 98 |

It is seen from Table I-2 that when an aluminum substrate subjected to anodization or further to silicate solution was used as the support, the on-press developability was excellent.

In the lithographic printing plate precursor of the present invention, the heat-sensitive layer provided on a hydrophilic support contains a fine particulate polymer capable of combining by heat at the time of image formation and having a functional group capable of reacting with a functional group present in another fine particulate polymer or with a functional group present in another component in the heat-sensitive layer, whereby the lithographic printing plate precursor can have high sensitivity and high press life, provide a printed matter free of residual color and staining, exhibit good on-press developability and print a larger number of printed matters. By further incorporating a light-to-heat converting material into the heat-sensitive layer or providing a layer containing a light-to-heat converting material between the support and the heat-sensitive layer, plate-making can be performed using scan exposure based on digital signals. Furthermore, by using an aluminum substrate subjected to anodization or further to silicate treatment as the support, more excellent on-press developability can be obtained.

Examples II-1 to II-6 and Comparative Examples II-1 to II-3

Preparation of Support (1) (Preparation of Aluminum Substrate)

As the Support (1), Aluminum Substrates A, B and C were prepared in the same manner as in Examples I-1 to I-7.

Preparation of Support (2) (Preparation of Support Comprising Aluminum Substrate having provided thereon Exothermic Hydrophilic Layer)

Support (2) was prepared in the same manner as in Examples I-1 to I-7.

Preparation of Support (3) (preparation of support comprising aluminum substrate having provided thereon heat-insulating hydrophilic layer)

Support (3) was prepared in the same manner as in Examples I-1 to I-7.

Synthesis of Fine Particulate Polymer Incapable of Combining by Heat

Synthesis (1) of Fine Particulate Polymer Incapable of Combining by Heat

To a reaction system, 7.5 g of glycidyl methacrylate, 3.5 g of trimethylolpropane triacrylate, 4.0 g of methyl methacrylate and 200 ml of an aqueous polyoxyethylene phenol solution (concentration: $9.8\times10^{-3}$ mol/liter) were added, and while stirring at 250 rpm, the inside of the system was purged with nitrogen gas. The resulting solution was adjusted to 25° C. and thereto 10 ml of an aqueous cerium (IV) ammonium salt solution (concentration: $0.984\times10^{-3}$ $mol\cdot l^{-1}$) was added. At this time, an aqueous ammonium nitrate solution (concentration: $58.8\times10^{-3}$ $mol\cdot l^{-1}$) was added to adjust the pH to 1.3 to 1.4. Thereafter, the solution was stirred for 8 hours. The thus-obtained solution had a solids concentration of 9.5% and an average particle size of 0.4 $\mu$m.

Synthesis (2) of Fine Particulate Polymer Incapable of Combining by Heat 7.5 g of allyl methacrylate, 5.5 g of styrene and 2.0 g of divinyl benzene were polymerized in the same manner. The thus-obtained solution had a solids concentration of 9.5% and an average particle size of 0.4 $\mu$m.

Synthesis (3) of Fine Particulate Polymer (Comparative Example) (not having a Reactive Group)

15 g of styrene was polymerized in the same manner. The thus-obtained solution had a solids concentration of 9.0% and an average particle size of 0.3 $\mu$m.

Coating of Heat-sensitive Layer

Coating solutions each having the following composition containing the fine particulate polymer of Synthesis Example (1), (2) or (3) were prepared and coated on Support (1) (2) or (3) prepared above to form a heat-sensitive layer.

Composition of Coating Solution for Heat-sensitive Layer

| | |
|---|---|
| Water | 100 g |
| Fine Particulate Polymer (1), (2) or (3) synthesized above (in terms of solids content) | 5 g |
| Polyhydroxyethyl acrylate (weight average molecular weight: 25,000) | 0.5 g |
| Infrared Absorbing Dye (I-32) | 0.3 g |

The coating solution was bar-coated and then dried in an oven at 100° C. for 60 seconds. The coated amount was 0.5 g/m$^2$.

The thus-obtained lithographic printing plate capable of on-press development was exposed in Trendsetter 3244VFS manufactured by Creo, on which a water cooling 40 W infrared semiconductor laser was mounted, under the conditions such that the output was 9 W, the rotation number of the outer drum was 210 rpm, the plate surface energy was 100 mJ/cm$^2$ and the resolution was 2,400 dpi. Thereafter, without passing through development, the plate was fixed to a cylinder of a printing machine Heidelberg SOR-M and by supplying fountain solution, then supplying ink and further feeding paper, printing was performed. All plates could be on-press developed without any problem and used for printing. Furthermore, the plate was aged at 60° C. for 3 days and then on-press developed to examine the level of staining. The number of sheets of the printed matter obtained with each plate is shown in Table II-1 below.

TABLE II-1

| | Support | Heat-Sensitive Layer | Number of Sheets Printed | Staining After Aging |
|---|---|---|---|---|
| Example II-1 | (1) | Fine Particulate Polymer (1) | 5,000 | not stained |
| Example II-2 | (2) | Fine Particulate Polymer (1) | 10,000 | not stained |
| Example II-3 | (3) | Fine Particulate Polymer (1) | 15,000 | not stained |
| Example II-4 | (1) | Fine Particulate Polymer (2) | 3,000 | not stained |
| Example II-5 | (2) | Fine Particulate Polymer (2) | 6,000 | not stained |
| Example II-6 | (3) | Fine Particulate Polymer (2) | 10,000 | not stained |
| Comparative Example II-1 | (1) | Fine Particulate Polymer (3) | 1,000 | stained |
| Comparative Example II-2 | (2) | Fine Particulate Polymer (3) | 1,500 | stained |
| Comparative Example II-3 | (3) | Fine Particulate Polymer (3) | 2,000 | stained |

It is seen from these results that when a fine particulate polymer incapable of combining by heat used for the image formation was used, good press life was obtained. Furthermore, in the case where the support was an aluminum substrate having provided thereon an exothermic hydrophilic layer or an aluminum substrate having provided thereon a heat-insulating layer and further provided thereon an exothermic hydrophilic layer, the press life was more excellent.

Example II-7

A coating solution for the heat-sensitive layer comprising the following composition was coated on Support (3).

| | |
|---|---|
| Water | 100 g |
| Fine Particulate Polymer (2) synthesized above (in terms of solids content) | 5 g |
| Polyacrylic acid (weight average molecular weight: 25,000) | 0.5 g |
| Sorbitol triacrylate | 1.0 g |
| Infrared Absorbing Dye (I-31) | 0.3 g |

The thus-obtained plate was exposed and used for printing in the same manner as in Example II-1 to II-6, as a result, 20,000 sheets could be printed without any abnormality.

Example II-8

A coating solution for the heat-sensitive layer comprising the following composition was coated on Support (3).

| | |
|---|---|
| Water | 100 g |
| Fine Particulate Polymer (1) synthesized above (in terms of solids content) | 5 g |
| Polyacrylic acid (weight average molecular weight: 25,000) | 0.5 g |
| Diethylenetriamine | 1.0 g |
| Infrared Absorbing Dye (I-31) | 0.3 g |

The thus-obtained plate was exposed in Luxel T-9000CTP manufactured by Fuji Photo Film Co., Ltd., on which a multi-channel laser head was mounted, under the conditions that the output was 250 mW per 1 beam, the rotation number of the outer drum was 800 rpm and the resolution was 2,400 dpi. Using this plate, printing was performed in the same manner as in Example II-1 to II-6, as a result, 30,000 sheets could be printed without any abnormality.

Examples II-9 to II-11

Lithographic printing plate precursors were prepared, image exposed and used for printing in the same manner as in Example II-1 except for using Aluminum Substrates A to C obtained in the Preparation of Support (1), and then evaluated on the on-press developability.

The on-press developability was evaluated by examining how large % the shadow part of a halftone image of 150 lines/inch on the 100th printed matter from the initiation of printing could be reproduced and as the value obtained was higher, the on-press developability was evaluated more excellent.

The results obtained are shown in Table II-2 below.

TABLE II-2

Resistance against Staining at Printing

| | Aluminum Substrate | Reproducibility of Shadow Part (%) |
|---|---|---|
| Example II-9 | Aluminum Substrate A | 90 |
| Example II-10 | Aluminum Substrate B | 95 |
| Example II-11 | Aluminum Substrate C | 98 |

It is seen from Table I-2 that when an aluminum substrate subjected to anodization or further to silicate solution was used as the support, the on-press developability was excellent.

In the lithographic printing plate precursor of the present invention, the heat-sensitive layer provided on a hydrophilic support contains a fine particulate polymer incapable of combining by heat used for the image formation and having a functional group capable of reacting with a functional group present in another fine particulate polymer or with a functional group present in another component in the heat-sensitive layer, whereby the lithographic printing plate precursor can have high sensitivity and high press life, provide a printed matter free of residual color and staining, exhibit good on-press developability even after aging, and print a larger number of printed matters. By further incorporating a light-to-heat converting material into the heat-sensitive layer or providing a layer containing a light-to-heat converting material between the support and the heat-sensitive layer, plate-making can be performed using scan exposure based on digital signals. Furthermore, by using an aluminum substrate subjected to anodization or further to silicate treatment as the support, more excellent on-press developability can be obtained.

Examples III-1 to III-6 and Comparative Examples III-1 to III-3

Preparation of Support (1) (Preparation of Aluminum Substrate)

As the Support (1), Aluminum Substrates A, B and C were prepared in the same manner as in Examples I-1 to I-7.

Preparation of Support (2) (Preparation of Support Comprising Aluminum substrate having provided thereon Exothermic Hydrophilic Layer)

Support (2) was prepared in the same manner as in Examples I-1 to I-7.

Preparation of Support (3) (Preparation of Support Comprising Aluminum Substrate having provided thereon Heat-insulating Hydrophilic Layer)

Support (3) was prepared in the same manner as in Examples I-1 to I-7.

Synthesis of Microcapsule

Synthesis (1) of Microcapsule having Outer Wall Incapable of Rupturing by Heat

As the oil phase component, 30 g of D-110 N (produced by Takeda Yakuhin Kogyo), 10 g of Karenz MOI (produced by Showa Denko) (2-methacryloyloxyethyl isocyanate), 10 g of trimethylolpropane triacrylate and 10 g of Pionine A41C (produced by Takemoto Yushi) (allyl methacrylate and butyl methacrylate copolymer (60/40 by mol)) were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.25 μm.

Synthesis (2) of Microcapsule having Outer Wall Incapable of Rupturing by Heat

As the oil phase component, 40 g of D-110 N (produced by Takeda Yakuhin Kogyo), 20 g of diethylene glycol diglycidyl ether and 0.1 g of Pionine A41C (produced by Takemoto Yushi) were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.18 μm.

Synthesis (1) of Fine Particulate Polymer (Comparative Example) (not having a reactive group):

To a reaction system, 15 g of styrene and 200 ml of an aqueous polyoxyethylene phenol solution (concentration: $9.84\times10^{-3}$ $mol\cdot l^{-1}$) were added and while stirring at 250 rpm, the inside of the system was purged with nitrogen gas. The resulting solution was adjusted to 25° C. and thereto 10 ml of an aqueous cerium(IV) ammonium salt solution (concentration: $0.984\times10^{-3}$ $mol\cdot l^{-1}$) was added. At this time, an aqueous ammonium nitrate solution (concentration: $58.8\times10^{-3}$ $mol\cdot l^{-1}$) was added to adjust the pH to 1.3 to 1.4. Thereafter, the solution was stirred for 8 hours. The thus-obtained solution had a solids concentration of 9.5% and an average particle size of 0.4 μm.

Coating of Heat-sensitive Layer

Coating solutions each having the following composition containing the microcapsule of Synthesis Example (1) or (2) or fine particulate polymer of Synthesis Example (1) were prepared and coated on Support (1), (2) or (3) prepared above to form a heat-sensitive layer.

Composition of Coating Solution for Heat-sensitive Layer

| | |
|---|---|
| Water | 70 g |
| 1-Methoxy-2-propanol | 30 g |
| Microcapsule (1) or (2) or Fine Particulate Polymer (1) synthesized above (in terms of solids content) | 5 g |
| Polyhydroxyethyl acrylate | 0.5 g |
| Sulfate of p-diazophenylamine | 0.3 g |
| Infrared Absorbing Dye (I-32) | 0.3 g |

The coating solution was bar-coated and then dried in an oven at 100° C. for 60 seconds. The coated amount was 0.5 $g/m^2$.

The thus-obtained lithographic printing plate capable of on-press development was exposed in Trendsetter 3244VFS manufactured by Creo, on which a water cooling 40 W infrared semiconductor laser was mounted, under the conditions such that the output was 9 W, the rotation number of the outer drum was 105 rpm, the plate surface energy was 200 $mJ/cm^2$ and the resolution was 2,400 dpi. Thereafter, without passing through development, the plate was fixed to a cylinder of a printing machine Heidelberg SOR-M and by supplying fountain solution, then supplying ink and further feeding paper, printing was performed. All plates could be on-press developed without any problem and used for printing. The number of sheets of the printed matter obtained with each plate is shown in Table III-1 below.

TABLE III-1

| | Support | Heat-Sensitive Layer | Number of Sheets Printed | Staining After Aging |
|---|---|---|---|---|
| Example III-1 | (1) | Microcapsule (1) | 5,000 | not stained |
| Example III-2 | (2) | Microcapsule (1) | 10,000 | not stained |
| Example III-3 | (3) | Microcapsule (1) | 15,000 | not stained |
| Example III-4 | (1) | Microcapsule (2) | 3,000 | not stained |
| Example III-5 | (2) | Microcapsule (2) | 7,000 | not stained |

TABLE III-1-continued

| | Support | Heat-Sensitive Layer | Number of Sheets Printed | Staining After Aging |
|---|---|---|---|---|
| Example III-6 | (3) | Microcapsule (2) | 10,000 | not stained |
| Comparative Example III-1 | (1) | Fine Particulate Polymer (1) | 1,000 | stained |
| Comparative Example III-2 | (2) | Fine Particulate Polymer (1) | 1,500 | stained |
| Comparative Example III-3 | (3) | Fine Particulate Polymer (1) | 2,000 | stained |

It is seen from these results that lithographic printing plates having a heat-sensitive layer containing the microcapsule had excellent press life. Furthermore, in the case where the support was an aluminum substrate having provided thereon an exothermic hydrophilic layer or an aluminum substrate having provided thereon a heat-insulating layer and further provided thereon an exothermic hydrophilic layer, the press life was more excellent.

It is also seen that by using Microcapsule (1) or (2) having outer wall incapable of rupturing by heat upon irradiation of a laser, the staining scarcely occurred when the printing was performed after aging at 60° C. for 3 days, as compared with the case using Fine Particulate Polymer (1).

Example III-7

A coating solution for the heat-sensitive layer comprising the following composition was coated on Support (3).

| | |
|---|---|
| Water | 100 g |
| 1-Methoxy-2-propanol | 30 g |
| Microcapsule (1) synthesized above (in terms of solids content) | 5 g |
| Polyacrylic acid (weight average molecular weight: 25,000) | 0.5 g |
| Sorbitol triacrylate | 1.0 g |
| Infrared Absorbing Dye (I-31) | 0.3 g |
| Sulfate of t-butyldiphenyl iodonium | 0.3 g |

The thus-obtained plate was exposed in Luxel T-9000CTP manufactured by Fuji Photo Film Co., Ltd., on which a multi-channel laser head was mounted, under the conditions that the output was 250 mW per 1 beam, the rotation number of the outer drum was 400 rpm and the resolution was 2,400 dpi. Using this plate, printing was performed in the same manner as in Example III-1 to III-6, as a result, 15,000 sheets could be printed without any abnormality.

Example III-8

A coating solution for the heat-sensitive layer comprising the following composition was coated on Support (3).

| | |
|---|---|
| Water | 100 g |
| 1-Methoxy-2-propanol | 30 g |
| Microcapsule (2) (in terms of solids content) | 5 g |
| Polyacrylic acid (weight average molecular weight: 25,000) | 0.5 g |

-continued

| | |
|---|---|
| Diethylenetriamine | 1.0 g |
| Infrared Absorbing Dye (I-31) | 0.3 g |
| Sulfate of t-butyldiphenyl iodonium | 0.3 g |

The thus-obtained plate was exposed in Luxel T-9000CTP manufactured by Fuji Photo Film Co., Ltd., on which a multi-channel laser head was mounted, under the conditions that the output was 250 mW per 1 beam, the rotation number of the outer drum was 400 rpm and the resolution was 2,400 dpi. Using this plate, printing was performed in the same manner as in Example III-1 to III-6, as a result, 30,000 sheets could be printed without any abnormality.

Examples III-9 to III-11

Lithographic printing plate precursors were prepared, image exposed and used for printing in the same manner as in Examples III-1 to III-6 except for preparing the following Microcapsules (3) and (4) and coating a coating solution for the heat-sensitive layer having the following composition on Support (1).

Synthesis (3) of Microcapsule having Outer Wall Incapable of Rupturing by Heat

As the oil phase component, 30 g of D-110 N (produced by Takeda Yakuhin Kogyo), 10 g of 2-methacryloyloxyethyl isocyanate, 9 g of trimethylolpropane diacrylate, 8 g of allyl methacrylate and butyl acrylate copolymer (60/40 by mol), 3 g of Infrared Absorbing Dye (I-33) and 0.1 g of Pionine A41C (produced by Takemoto Yushi) were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.20 $\mu$m.

Synthesis (4) of Microcapsule having Outer Wall Incapable of Rupturing by Heat

As the oil phase component, 30 g of D-110 N (produced by Takeda Yakuhin Kogyo), 10 g of 2-methacryloyloxyethyl isocyanate, 9 g of trimethylolpropane diacrylate, 8 g of allyl methacrylate and butyl acrylate copolymer (60/40 by mol), 3 g of Infrared Absorbing Dye (I-33), 0.1 g of Pionine A41C (produced by Takemoto Yushi) and 1.0 g of 2,2'-azobisisobutyronitrile were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.25 $\mu$m.

Composition of Coating Solution for Heat-sensitive Layer of Example III-9

| | |
|---|---|
| Water | 70 g |
| 1-Methoxy-2-propanol | 30 g |
| Microcapsule (3) synthesized above | 5 g |

-continued

| | |
|---|---|
| Polyhydroxyethyl acrylate | 0.5 g |
| p-Diazophenylamine sulfate | 0.3 g |

Composition of Coating Solution for Heat-sensitive Layer of Example III-10

| | |
|---|---|
| Water | 70 g |
| 1-Methoxy-2-propanol | 30 g |
| Microcapsule (3) synthesized above | 5 g |
| Polyhydroxyethyl acrylate | 0.5 g |
| p-Diazophenylamine sulfate | 0.3 g |
| Infrared Absorbing Dye (I-32) | 0.1 g |

Composition of Coating Solution for Heat-sensitive Layer of Example III-11

| | |
|---|---|
| Water | 70 g |
| 1-Methoxy-2-propanol | 30 g |
| Microcapsule (4) synthesized above | 5 g |
| Polyhydroxyethyl acrylate | 0.5 g |
| p-Diazophenylamine sulfate | 0.3 g |
| Infrared Absorbing Dye (I-32) | 0.1 g |

In Examples III-9 and III-10, the number of sheets which could be printed was 10,000, and in Example III-11, the number of sheets which could be printed was 15,000, revealing high press life as compared with Example III-1 (5,000 sheets) where the microcapsule contained no light-to-heat converting substance. By further incorporating a compound capable of initiating and accelerating the reaction into the microcapsule, higher press life could be obtained. When printing was performed after aging at 60° C. for 3 days, the resistance against staining was on the same level as in Example III-1.

Examples III-12 to III-14

Lithographic printing plate precursors were prepared, image exposed and used for printing in the same manner as in Example III-1 except for using Aluminum Substrates A to C obtained in the Preparation of Support (1), and then evaluated on the on-press developability.

The on-press developability was evaluated by examining how large % the shadow part of a halftone image of 150 lines/inch on the 100th printed matter from the initiation of printing could be reproduced and as the value obtained was higher, the on-press developability was evaluated more excellent.

The results obtained are shown in Table III-2 below.

TABLE III-2

Resistance against Staining at Printing

| | Aluminum Substrate | Reproducibility of Shadow Part (%) |
|---|---|---|
| Example III-12 | Aluminum Substrate A | 90 |
| Example III-13 | Aluminum Substrate B | 95 |
| Example III-14 | Aluminum Substrate C | 98 |

It is seen from Table III-2 that when an aluminum substrate subjected to anodization or further to silicate solution was used as the support, the on-press developability was excellent.

In the lithographic printing plate precursor of the present invention, the heat-sensitive layer provided on a hydrophilic support contains a microcapsule having outer wall incapable of rupturing by heat used for the image formation and having a functional group capable of reacting by heat, whereby the lithographic printing plate precursor can have high sensitivity and high press life, provide, a printed matter free of residual color and staining, exhibit good on-press developability even after aging of the plate, and print a larger number of printed matters. Furthermore, by using an aluminum substrate subjected to anodization or further to silicate treatment as the support, more excellent on-press developability can be obtained.

Examples IV-1 to IV-6 and Comparative Examples IV-1 to IV-3

Preparation of Support (1) (Preparation of Aluminum Substrate)

As the Support (1), Aluminum Substrates A, B and C were prepared in the same manner as in Examples I-1 to I-7.

Preparation of Support (2) (Preparation of Support Comprising Aluminum Substrate having provided thereon Exothermic Hydrophilic Layer)

Support (2) was prepared in the same manner as in Examples I-1 to I-7.

Preparation of Support (3) (Preparation of Support Comprising Aluminum Substrate having provided thereon Heat-insulating Hydrophilic Layer)

Support (3) was prepared in the same manner as in Examples I-1 to I-7.

Synthesis of Microcapsule

Synthesis (1) of Microcapsule having Outer Wall Capable of Rupturing by Heat

As the oil phase component, 40 g of xylene diisocyanate, 10 g of trimethylolpropane diacrylate and 10 g of Pionine A41C (produced by Takemoto Yushi) (allyl methacrylate and butyl methacrylate copolymer (60/40 by mol)) were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.25 $\mu$m.

Synthesis (2) of Microcapsule having Outer Wall Capable of Rupturing by Heat

As the oil phase component, 30 g of isophorone diisocyanate, 10 g of hexamethylene diisocyanate, 20 g of diethylene glycol diglycidyl ether and 0.1 g of Pionine A41C (produced by Takemoto Yushi) were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.40 $\mu$m.

Synthesis (1) of Fine Particulate Polymer (Comparative Example) (not having a Reactive Group)

To a reaction system, 15 g of styrene and 200 ml of an aqueous polyoxyethylene phenol solution (concentration: $9.84\times10^{-3}$ $mol \cdot l^{-1}$) were added and while stirring at 250 rpm, the inside of the system was purged with nitrogen gas.

The resulting solution was adjusted to 25° C. and thereto 10 ml of an aqueous cerium(IV) ammonium salt solution (concentration: $0.984\times10^{-3}$ mol.$^{-1}$) was added. At this time, an aqueous ammonium nitrate solution (concentration: $58.8\times10^{-3}$ mol·l$^{-1}$) was added to adjust the pH to 1.3 to 1.4. Thereafter, the solution was stirred for 8 hours. The thus-obtained solution had a solids concentration of 9.5% and an average particle size of 0.4 μm.

Coating of Heat-sensitive Layer

Coating solutions each having the following composition containing the microcapsule of Synthesis Example (1) or (2) or fine particulate polymer of Synthesis Example (1) were prepared and coated on Support (1), (2) or (3) prepared above to form a heat-sensitive layer.

Composition of Coating Solution for Heat-sensitive Layer

| | |
|---|---|
| Water | 70 g |
| 1-Methoxy-2-propanol | 30 g |
| Microcapsule (1) or (2) or Fine Particulate Polymer (1) synthesized above (in terms of solids content) | 5 g |
| Polyhydroxyethyl acrylate | 0.5 g |
| Sulfate of p-diazophenylamine | 0.3 g |
| Infrared Absorbing Dye (I-32) | 0.3 g |

The coating solution was bar-coated and then dried in an oven at 90° C. for 120 seconds. The coated amount was 0.5 g/m$^2$.

The thus-obtained lithographic printing plate capable of on-press development was exposed in Trendsetter 3244VFS manufactured by Creo, on which a water cooling 40 W infrared semiconductor laser was mounted, under the conditions such that the output was 9 W, the rotation number of the outer drum was 210 rpm, the plate surface energy was 100 mJ/cm2 and the resolution was 2,400 dpi. Thereafter, without passing through development, the plate was fixed to a cylinder of a printing machine Heidelberg SOR-M and by supplying fountain solution, then supplying ink and further feeding paper, printing was performed. All plates could be on-press developed without any problem and used for printing. The number of sheets of the printed matter obtained with each plate is shown in Table IV-1 below.

TABLE IV-1

| | Support | Heat-Sensitive Layer | Number of Sheets Printed |
|---|---|---|---|
| Example IV-1 | (1) | Microcapsule (1) | 9,000 |
| Example IV-2 | (2) | Microcapsule (1) | 12,000 |
| Example IV-3 | (3) | Microcapsule (1) | 20,000 |
| Example IV-4 | (1) | Microcapsule (2) | 7,000 |
| Example IV-5 | (2) | Microcapsule (2) | 12,000 |
| Example IV-6 | (3) | Microcapsule (2) | 15,000 |
| Comparative Example IV-1 | (1) | Fine Particulate Polymer (1) | 1,000 |
| Comparative Example IV-2 | (2) | Fine Particulate Polymer (1) | 1,500 |
| Comparative Example IV-3 | (3) | Fine Particulate Polymer (1) | 1,800 |

It is seen from these results that lithographic printing plates having a heat-sensitive layer containing the microcapsule had excellent press life. Furthermore, in the case where the support was an aluminum substrate having provided thereon an exothermic hydrophilic layer or an aluminum substrate having provided thereon a heat-insulating layer and further provided thereon an exothermic hydrophilic layer, the press life was more excellent.

It is also seen that by using Microcapsule (1) or (2) having outer wall capable of rupturing by heat upon irradiation of a laser, the press life was high at a low-energy exposure as compared with the case using Fine Particulate Polymer (1).

Example IV-7

A coating solution for the heat-sensitive layer comprising the following composition was coated on Support (3).

| | |
|---|---|
| Water | 70 g |
| 1-Methoxy-2-propanol | 30 g |
| Microcapsule (1) synthesized above (in terms of solids content) | 5 g |
| Polyacrylic acid (weight average molecular weight: 25,000) | 0.5 g |
| Sorbitol triacrylate | 1.0 g |
| Infrared Absorbing Dye (I-31) | 0.3 g |
| Sulfate of t-butyldiphenyl iodonium | 0.3 g |

The thus-obtained plate was exposed in Luxel T-9000CTP manufactured by Fuji Photo Film Co., Ltd., on which a multi-channel laser head was mounted, under the conditions that the output was 250 mW per 1 beam, the rotation number of the outer drum was 800 rpm and the resolution was 2,400 dpi. Using this plate, printing was performed in the same manner as in Example IV-1 to IV-6, as a result, 15,000 sheets could be printed without any abnormality.

Example IV-8

A coating solution for the heat-sensitive layer comprising the following composition was coated on Support (3).

| | |
|---|---|
| Water | 70 g |
| 1-Methoxy-2-propanol | 30 g |
| Microcapsule (2) (in terms of solids content) | 5 g |
| Polyacrylic acid (weight average molecular weight: 25,000) | 0.5 g |
| Diethylenetriamine | 1.0 g |
| Infrared Absorbing Dye (I-31) | 0.3 g |
| Sulfate of t-butyldiphenyl iodonium | 0.3 g |

The thus-obtained plate was exposed in Luxel T-9000CTP manufactured by Fuji Photo Film Co., Ltd., on which a multi-channel laser head was mounted, under the conditions that the output was 250 mW per 1 beam, the rotation number of the outer drum was 800 rpm and the resolution was 2,400 dpi. Using this plate, printing was performed in the same manner as in Example IV-1 to IV-6, as a result, 30,000 sheets could be printed without any abnormality.

Examples IV-9 to IV-11

Lithographic printing plate precursors were prepared, image exposed and used for printing in the same manner as in Examples IV-1 to IV-6 except for preparing the following Microcapsules (3) and (4) and coating a coating solution for the heat-sensitive layer having the following composition on Support (1).

Synthesis (3) of Microcapsule having Outer Wall Capable of Rupturing by Heat

As the oil phase component, 40 g of xylene diisocyanate, 9 g of trimethylolpropane diacrylate, 8 g of allyl methacrylate and butyl acrylate copolymer (60/40 by mol), 3 g of Infrared Absorbing Dye (I-33) and 0.1 g of Pionine A41C (produced by Takemoto Yushi) were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.25 μm.

Synthesis (4) of Microcapsule having Outer Wall Capable of Rupturing by Heat

As the oil phase component, 40 g of xylene diisocyanate, 9 g of trimethylolpropane diacrylate, 8 g of allyl methacrylate and butyl acrylate copolymer (60/40 by mol), 3 g of Infrared Absorbing Dye (I-33), 0.1 g of Pionine A41C (produced by Takemoto Yushi) and 1.0 g of 2,2'-azobisisobutyronitrile were dissolved in 80 g of ethyl acetate. As the aqueous phase component, 120 g of a 4% aqueous solution of PVA205 (produced by Kuraray) was prepared. The oil phase component and the aqueous phase component were emulsified using a homogenizer at 10,000 rpm. Thereafter, 40 g of water was added and the resulting solution was stirred at room temperature for 30 minutes and further at 40° C. for 3 hours. The thus-obtained microcapsule solution had a solids concentration of 20% and an average particle size of 0.35 μm.

Composition of Coating Solution for Heat-sensitive Layer of Example IV-9:

| | |
|---|---|
| Water | 70 g |
| 1-Methoxy-2-propanol | 30 g |
| Microcapsule (3) synthesized above | 5 g |
| Polyhydroxyethyl acrylate | 0.5 g |
| p-Diazophenylamine sulfate | 0.3 g |

Composition of Coating Solution for Heat-sensitive Layer of Example IV-10

| | |
|---|---|
| Water | 70 g |
| 1-Methoxy-2-propanol | 30 g |
| Microcapsule (3) synthesized above | 5 g |
| Polyhydroxyethyl acrylate | 0.5 g |
| p-Diazophenylamine sulfate | 0.3 g |
| Infrared Absorbing Dye (I-32) | 0.1 g |

Composition of Coating Solution for Heat-sensitive Layer of Example IV-11

| | |
|---|---|
| Water | 70 g |
| 1-Methoxy-2-propanol | 30 g |
| Microcapsule (4) synthesized above | 5 g |
| Polyhydroxyethyl acrylate | 0.5 g |
| p-Diazophenylamine sulfate | 0.3 g |
| Infrared Absorbing Dye (I-32) | 0.1 g |

In Examples IV-9 and IV-10, the number of sheets which could be printed was 15,000, and in Example IV-11, the number of sheets which could be printed was 25,000, revealing high press life as compared with Example IV-1 (9,000 sheets) where the microcapsule contained no light-to-heat converting substance. By further incorporating a compound capable of initiating and accelerating the reaction into the microcapsule, higher press life could be obtained.

Examples IV-12 to IV-14

Lithographic printing plate precursors were prepared, image exposed and used for printing in the same manner as in Example IV-1 except for using Aluminum Substrates A to C obtained in the Preparation of Support (1), and then evaluated on the on-press developability.

The on-press developability was evaluated by examining how large % the shadow part of a halftone image of 150 lines/inch on the 100th printed matter from the initiation of printing could be reproduced and as the value obtained was higher, the on-press developability was evaluated more excellent.

The results obtained are shown in Table IV-2 below.

TABLE IV-2

| Resistance against Staining at Printing | | |
|---|---|---|
| | Aluminum Substrate | Reproducibility of Shadow Part (%) |
| Example IV-12 | Aluminum Substrate A | 90 |
| Example IV-13 | Aluminum Substrate B | 95 |
| Example IV-14 | Aluminum Substrate C | 98 |

It is seen from Table III-2 that when an aluminum substrate subjected to anodization or further to silicate solution was used as the support, the on-press developability was excellent.

In the lithographic printing plate precursor of the present invention, the heat-sensitive layer provided on a hydrophilic support contains a microcapsule having outer wall capable of rupturing by heat used for the image formation and having a functional group capable of reacting by heat, whereby the lithographic printing plate precursor can have high sensitivity and high press life, provide a printed matter free of residual color and staining, exhibit good on-press developability, and print a larger number of printed matters. Furthermore, by using an aluminum substrate subjected to anodization or further to silicate treatment as the support, more excellent on-press developability can be obtained.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a hydrophilic support having thereon a heat-sensitive layer containing a fine particulate polymer capable of combining by heat used for image formation wherein said fine particulate polymer has a functional group capable of reacting with a functional group present in another fine particulate polymer or with a functional group present in another component in the heat-sensitive layer and wherein said hydrophilic support is an aluminum substrate subjected to a surface roughening treatment and then to an anodization treatment and is further subjected to a silicate treatment.

2. A lithographic printing plate precursor comprising a hydrophilic support having thereon a heat-sensitive layer containing a fine particulate polymer incapable of combining by heat used for image formation wherein said fine particulate polymer has a functional group capable of reacting with a functional group present in another fine particulate polymer or with a functional group present in another component in the heat-sensitive layer and wherein said hydrophilic support is an aluminum substrate subjected to a surface roughening treatment and then to an anodization treatment and is further subjected to a silicate treatment.

3. A lithographic printing plate precursor comprising a hydrophilic support having thereon a heat-sensitive layer containing microcapsules containing a compound having a functional group capable of reacting by heat wherein said microcapsules have an outer wall incapable of rupturing by heat used for image formation and a light-to-heat converting material is contained in the heat-sensitive layer or in a layer adjacent thereto and wherein said hydrophilic support is an aluminum substrate subjected to a surface roughening treatment and then to an anodization treatment and is further subjected to a silicate treatment.

4. The lithographic printing plate precursor as claimed in claim 3, wherein said compound diffuses from said microcapsule and is present either on the surface of said microcapsule or in the vicinity of the surface.

5. The lithographic printing plate precursor as claimed in claim 3, which is obtained by dispersing microcapsules each containing a compound having a functional group capable of reacting by heat in a solvent which swells the outer wall of said microcapsule, coating said dispersion solution on a hydrophilic support and drying the solution.

6. A lithographic printing plate precursor comprising a hydrophilic support having thereon a heat-sensitive layer containing microcapsules containing a compound having a functional group capable of reacting by heat wherein said microcapsules have an outer wall capable of rupturing by heat used for image formation and a light-to-heat convening material is contained in the heat-sensitive layer or in a layer adjacent thereto and wherein said hydrophilic support is an aluminum substrate subjected to a surface roughening treatment and then to an anodization treatment and is further subjected to a silicate treatment.

* * * * *